US007102862B1

(12) United States Patent
Lien et al.

(10) Patent No.: US 7,102,862 B1
(45) Date of Patent: Sep. 5, 2006

(54) ELECTROSTATIC DISCHARGE PROTECTION CIRCUIT

(75) Inventors: Chuen-Der Lien, Los Altos Hills, CA (US); Ta-Ke Tien, Cupertino, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 106 days.

(21) Appl. No.: 10/283,532

(22) Filed: Oct. 29, 2002

(51) Int. Cl.
*H02H 9/00* (2006.01)
(52) U.S. Cl. ........................................................ 361/56
(58) Field of Classification Search ................ 361/56, 361/111; 257/355, 361
See application file for complete search history.

(56) References Cited

U.S. PATENT DOCUMENTS

| | | | | |
|---|---|---|---|---|
| 5,450,267 A | * | 9/1995 | Diaz et al. | 361/56 |
| 5,886,862 A | * | 3/1999 | Anderson et al. | 361/56 |
| 5,907,464 A | * | 5/1999 | Maloney et al. | 361/111 |
| 5,946,177 A | * | 8/1999 | Miller et al. | 361/56 |
| 6,008,970 A | * | 12/1999 | Maloney et al. | 361/56 |
| 6,069,782 A | | 5/2000 | Lien et al. | 361/111 |
| 6,320,735 B1 | | 11/2001 | Anderson | 361/111 |
| 6,356,427 B1 | * | 3/2002 | Anderson | 361/111 |
| 6,369,998 B1 | * | 4/2002 | Anderson | 361/111 |
| 6,400,540 B1 | | 6/2002 | Chang | 361/56 |
| 6,455,902 B1 | * | 9/2002 | Voldman | 257/378 |
| 6,674,622 B1 | * | 1/2004 | Yu et al. | 361/56 |
| 6,862,161 B1 | * | 3/2005 | Woo | 361/56 |

OTHER PUBLICATIONS

R. Merrill et al., "ESD Design Methodology." EOS/ESD Symposium Proceedings, 1993, pp. 223-237.
K. Seshan et al, "The Quality and Reliability of Intel's Quarter Micron Process," Intel Technology Journal Q3, 1998, pp. 1-11.

* cited by examiner

*Primary Examiner*—Brian Sircus
*Assistant Examiner*—Boris Benenson
(74) *Attorney, Agent, or Firm*—Finnegan, Henderson, et al.

(57) ABSTRACT

Circuits are disclosed for protecting internal circuitry of a semiconductor chip from increased power supply voltages due to electrostatic discharge (EDS). One example circuit includes a trigger circuit including a transistor and a capacitor arranged in series between DC pads. The trigger circuit generates a trigger signal to a discharge circuit connected between the DC pads to shunt charge from one of the DC pads to the other. The RC delay associated with the transistor and capacitor of the trigger circuit may be designed such that the trigger circuit generates the trigger signal in response to an ESD event, but not in response to high positive spikes on one of the DC pads during normal operation.

33 Claims, 17 Drawing Sheets ced ESD protection circuits 100, 120, 140, and
ELECTROSTATIC DISCHARGE PROTECTION CIRCUIT

TECHNICAL FIELD

The present circuit and method relate generally to electrostatic discharge protection for integrated circuits.

BACKGROUND

With advances in technology and the miniaturization of device elements in semiconductor integrated circuits, integrated circuits are becoming more susceptible to damage due to electrostatic discharge (ESD). In some applications, device elements have reached the submicron level in size and, correspondingly, MOS gate oxide films have become increasingly thin. As a result, the internal circuitry of an integrated circuit device is easily damaged by an ESD event.

Electrostatic discharge may be introduced into an integrated circuit in a variety of ways. One problematic ESD event occurs when ESD zapping occurs on DC power pads of an integrated circuit. A spike, such as an ESD spike, is not a DC voltage, but rather has a power spectrum containing only finite frequency components. Typically, this power spectrum lies in an interval around a characteristic frequency. Usually, the ESD spike will have a rise time of less than about one nanosecond.

Some conventional approaches to addressing this problem are illustrated in FIGS. 1A, 1B, 1C, and 1D, which illustrate conventional ESD protection circuits 100, 120, 140, and 160, respectively.

With reference to FIG. 1A, a high voltage $V_{cc}$ is applied to high voltage pad 102 and a ground voltage is applied to ground pad 104. The ground voltage may be referred to as $V_{ss}$. The circuit 100 includes a trigger circuit 106 and a discharge circuit 108. The trigger circuit 106 is coupled between the high voltage pad 102 and the ground pad 104 and provides a trigger signal at node 114.

The discharge circuit 108 is also coupled between the high voltage pad 102 and the ground pad 104. In response to the trigger signal, the discharge circuit 108 is capable of shunting charge, such as an electrostatic discharge, from the high voltage pad 102 to the ground pad 104. The discharge circuit 108 may include NMOS transistor 110, the gate of which is connected to node 114 and is controlled by the trigger signal $V_{tr}$.

In an ESD event, the trigger circuit 106 alters the trigger signal $V_{tr}$ and turns on the discharge circuit 108. The trigger circuit 106 includes a capacitor 112 connected between the high voltage pad 102 and the node 114 and a resistor 116 connected between the ground pad 104 and the node 114, with the capacitor 112 and the resistor 116 being arranged in series. The resistor 116 may comprise an NMOS transistor or other resistive element. The R*C range of the resistor 116 and the capacitor 112 of the circuit 100 of FIG. 1A is typically in the range of a few hundred nanoseconds to a few micro-seconds.

During an ESD event (i.e., an ESD zap at the high voltage pad 102) the voltage at node 114 goes high, thus turning on the discharge circuit 108 by placing a high voltage at the gate of the NMOS transistor 110, thereby turning on the transistor 110 and permitting current flow from the high voltage pad 102 through the transistor 110 to the ground pad 104. Hence, during an ESD event, the circuit 100 is capable of shunting an electrostatic discharge zap at the power pad 102 to the ground pad 104.

During normal operation, however, if on the high voltage pad 102, $V_{cc}$ has high positive spikes, the trigger circuit 106 will turn on the discharge circuit 108, thus causing current to flow from high voltage pad 102 through the transistor 110 to ground pad 104. This results in unnecessary power consumption and unnecessary noise during normal operation.

In particular, in the circuit 100 of FIG. 1A, when $V_{cc}$ has a high positive spike greater than the threshold voltage of the transistor 110, the transistor 110 will turn on (i.e., become highly conductive) and will permit current flow from the high voltage pad 102 to the ground pad 104.

The circuits 120, 140, and 160 of FIGS. 1B, 1C, and 1D comprise variations of the circuit 100. The circuit 120 of FIG. 1B is identical to the circuit 100 of FIG. 1A, except that the positions of the resistor 116 and the capacitor 112 are reversed and the NMOS transistor 110 is replaced with a PMOS transistor 111. The circuit 140 of FIG. 1C identical to the circuit of FIG. 1A, except that the positions of the resistor 116 and the capacitor 112 are reversed and an inverter 142 is positioned between the node 114 and the gate of the NMOS transistor 110. The circuit 160 of FIG. 1D identical to the circuit 100 of FIG. 1A, except that the NMOS transistor 110 is replaced with a PMOS transistor 161 and an inverter 162 is positioned between the node 114 and a gate of the PMOS transistor 161.

Thus, in the circuits 100 and 120 of FIGS. 1A and 1B, when a positive $V_{cc}$ spike occurs that is greater than the threshold voltage of the respective transistor 110, 111, the discharge circuit 108 will start to flow current. In the circuits 140 and 160 of FIGS. 1C and 1D, when the positive $V_{cc}$ spike is greater than the threshold voltage, the inverters 142, 162 will start to flow current.

U.S. Pat. No. 6,069,792 and R. Merrill and E. Issaq, "ESD Design Methodology," 1993 EOS/ESD Symposium Proceedings, pp. 223–237, and K. Seshan, T. Maloney, K. Wu "The Quality and Reliability of Intel's Quarter Micron Process," Intel Technology Journal, Q3 '98, disclose additional background information and are all hereby incorporated by reference.

SUMMARY

Accordingly, a need exists for an ESD protection circuit that effectively protects against ESD events, but reduces or prevents current flow through the ESD protection circuit during normal operation. Another need exists to provide an ESD protection circuit that does not turn on in response to positive $V_{cc}$ or other voltage spikes during normal operation.

In general, an ESD protection circuit is provided between at least two DC pads and includes a discharge circuit and a trigger circuit. The trigger circuit includes circuitry for preventing the discharge circuit from turning on during normal operation, including in response to positive voltage spikes, such as $V_{cc}$ spikes, at a DC pad. The trigger circuit turns on the discharge circuit during EDS events, which occur when no DC voltage is present across the DC pads.

In some embodiments, the trigger circuit includes a transistor and a capacitor arranged in series between first and second DC pads. During normal operation, the transistor is on (i.e., highly conductive) and maintains the discharge circuit off. This prevents the discharge circuit from turning on during normal operation in response to high positive spikes one of the first DC pad. The RC time constant associated with this transistor and capacitor may, in some embodiments, be less than about one nanosecond. The gate of the transistor may be controlled by a delay circuit disposed between the first and second DC pads, the delay circuit having an RC time constant of about 100 nanoseconds or more. Accordingly, some embodiments of the present invention are effective in turning on the discharge circuit in response to spikes having a time constant greater than that of the transistor and capacitor, but less than that of the delay circuit.

Some embodiments provide for selectively disabling the discharge circuit based on the voltage at a third DC pad. During ESD zapping, the voltage at the third DC pad is low and, therefore, the discharge circuit is not disabled when the voltage at the third DC pad is low. During normal operation, however, the voltage at the third DC pad is high and, therefore, the discharge circuit is disabled when the voltage at the third DC pad is high.

ESD protection circuits in accordance with the present invention may be used between any two high and low voltage pads $V_H$ and $V_L$. The high and low voltage pads $V_H$ and $V_L$ may comprise a variety of DC pads, such as, $V_{cc}$ to $V_{ss}$, $V_{ss1}$ to $V_{ss2}$, $V_{cc1}$ to $V_{cc2}$, etc.

Embodiments of the present invention are further described below with reference to the accompanying drawings.

BRIEF DESCRIPTION OF THE DRAWINGS

In the figures, similar elements are labeled similarly.

DETAILED DESCRIPTION

Figure 1A:
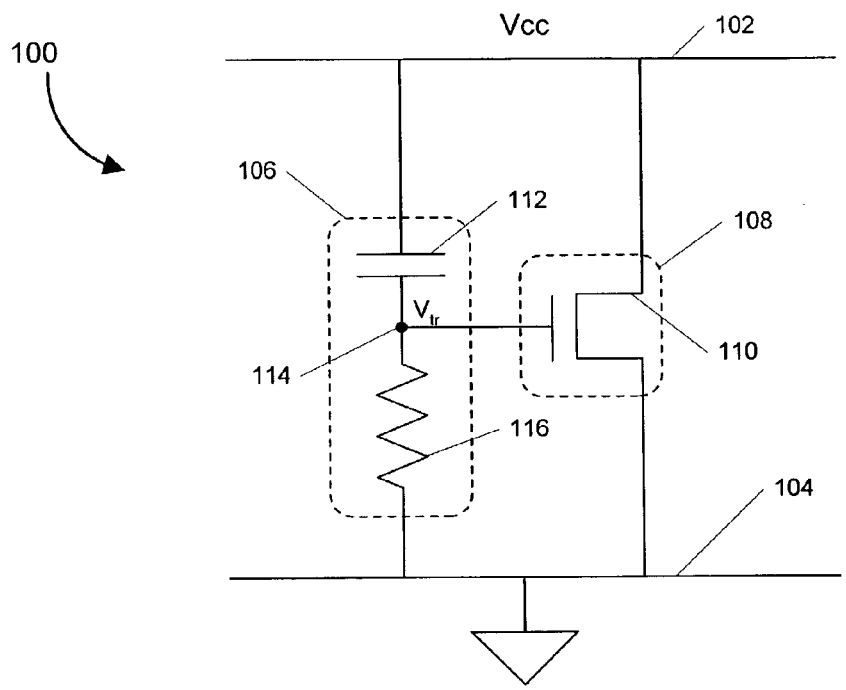
FIGS. 1A, 1B, 1C, and 1D illustrate conventional ESD protection circuits.
Figure 1B:
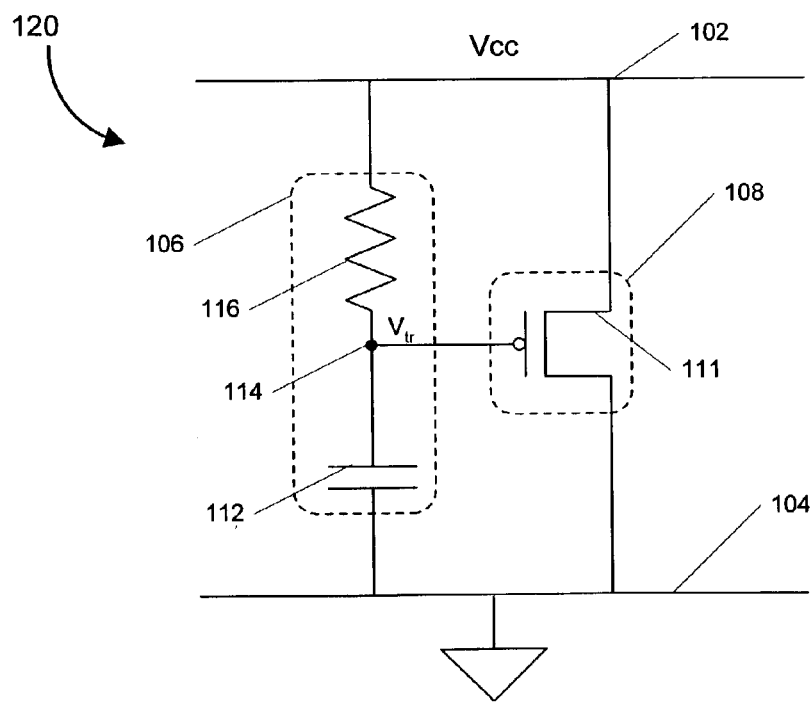
Figure 1C:
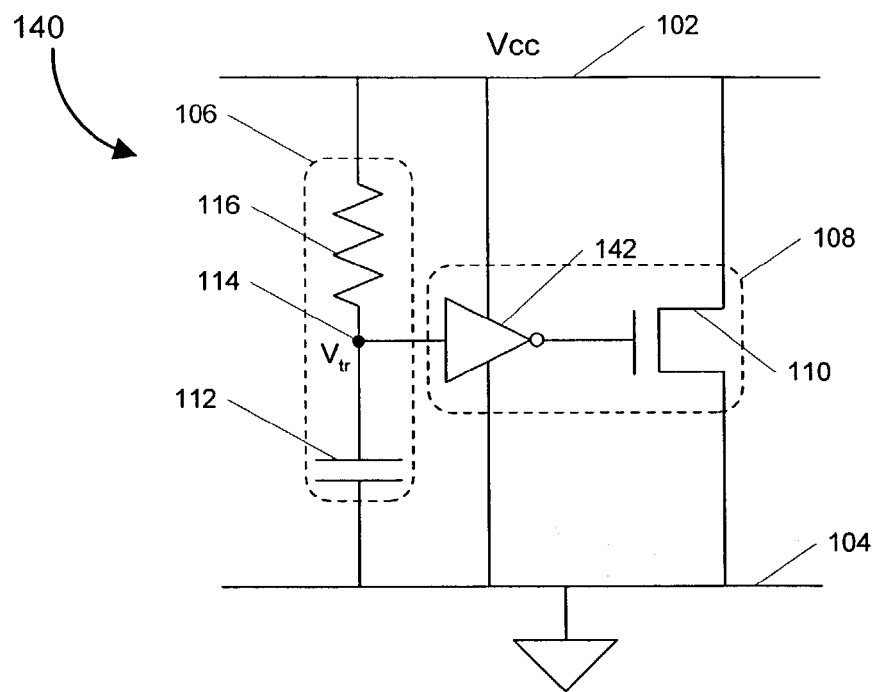
Figure 1D:
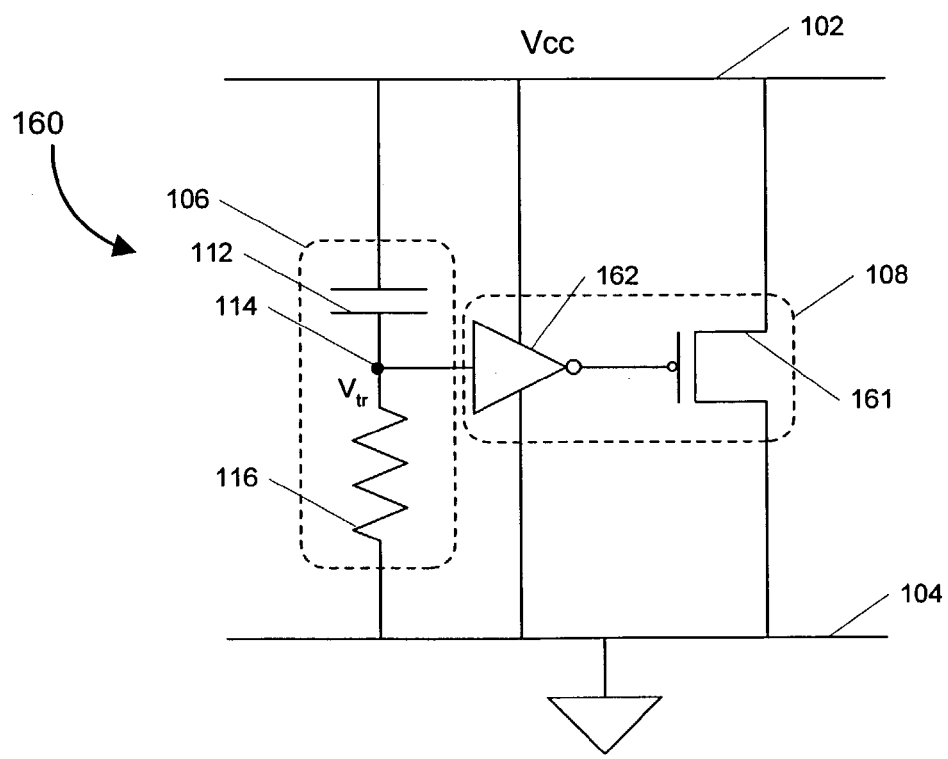
Figure 2A:
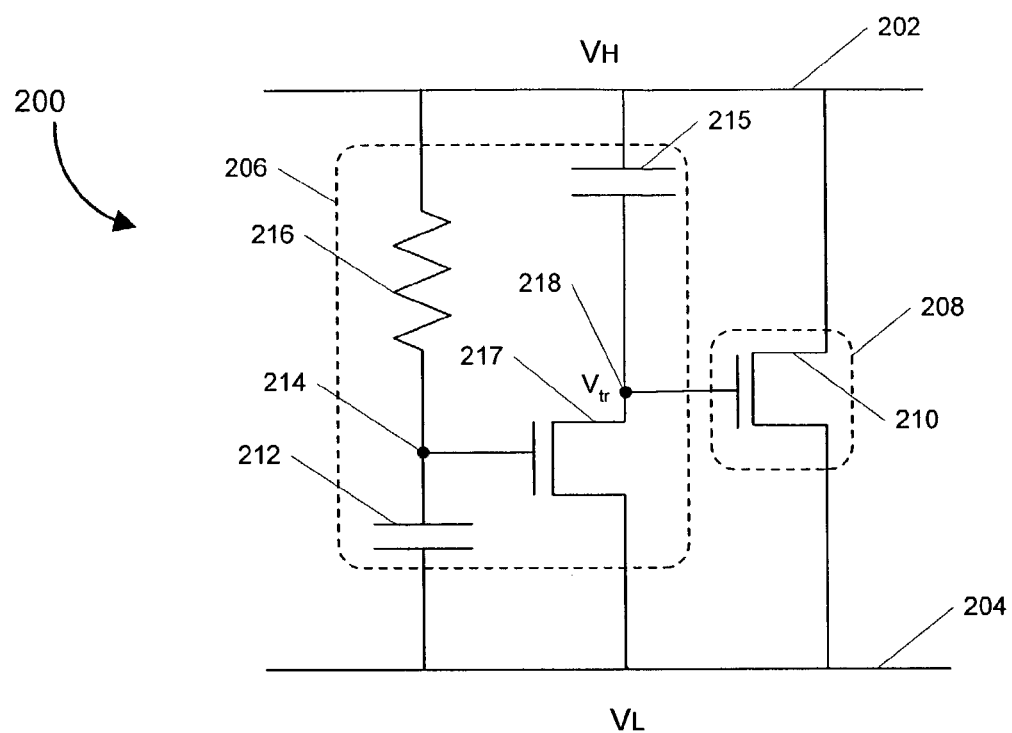
FIGS. 2A, 2B, 2C, and 2D illustrate ESD protection circuits in accordance with embodiments of the present invention.

FIG. 2A shows an ESD protection circuit 200 in accordance with an example embodiment of the present invention. Power supply voltage or other voltage is supplied to an integrated circuit chip between high voltage pad 202 and low voltage pad 204.

The circuit 200 includes a trigger circuit 206 and a discharge circuit 208. The trigger circuit 206 is coupled between the high voltage pad 202 and the low voltage pad 204 and provides a trigger signal $V_{tr}$ at node 218 to the discharge circuit 208. The discharge circuit 208 conducts current from the pad 202 to the pad 204 in response to the trigger signal $V_{tr}$.

The discharge circuit 208 is also coupled between the high voltage pad 202 and the low voltage pad 204. In response to the trigger signal $V_{tr}$, the discharge circuit 208 is capable of shunting charge, such as an electrostatic discharge, from the high voltage pad 202 to the low voltage pad 204. The discharge circuit 208 may include NMOS transistor 210 with terminals connected to the pads 202, 204. The gate of the NMOS transistor 210 is connected to the node 218 and is responsive to the trigger signal $V_{tr}$. Optionally, an NPN bipolar driver (not shown) may be used in place of the NMOS transistor 210. Additionally, and as described below, the NMOS transistor 210 may be replaced with an odd number of inverters and either a PMOS transistor or PNP bipolar driver.

In an ESD event, the trigger circuit 206 alters the trigger signal $V_{tr}$ at the node 218 and turns on the discharge circuit 208. The trigger circuit 206 includes a capacitor 212 connected between the pad 204 and the node 214 and a resistor 216 connected between the pad 202 and the node 214, with the capacitor 212 and the resistor 216 being arranged in series. The resistor 216 may comprise an NMOS transistor with gate connected to pad 202 (not shown) or other resistive element. The R*C range of the resistor 216 and the capacitor 212 is in the range of about 100 nanoseconds to a few microseconds.

The trigger circuit 206 also includes a capacitor 215 and a NMOS transistor 217 arranged in series between the pads 202, 204. One terminal of the capacitor 215 is connected to the pad 202 and the other terminal of the capacitor 215 is connected to node 218. A terminal of the NMOS transistor 217 is connected to the node 218 and the other terminal of the NMOS transistor 217 is connected to the low voltage pad 204. The gate of the NMOS transistor 217 is connected to the node 214, which controls the NMOS transistor 217.

In normal operation, the NMOS transistor 217 is on (i.e., highly conductive), thereby holding the gate of the transistor 210 low by asserting a low trigger signal $V_{tr}$. Presenting a low trigger signal $V_{tr}$ in this embodiment prevents the transistor 210 (or other driver) from turning on and conducting current between the high and low voltage pads 202, 204 during normal operation. The R*C time constant of the capacitor 215 and the NMOS transistor 217 in some embodiments is about 1 nanosecond or less. In other embodiments, the R*C time constant of the capacitor 215 and the NMOS transistor 217 is less than about 10 nanoseconds.

Due to the relatively short time constant of the capacitor 215 and the transistor 217, the trigger circuit 206 does not turn on the discharge circuit 208 in response to positive $V_H$ noise spikes, such as those that may be present at the high voltage pad 202. During an ESD event, the voltage at node 214 is low and NMOS transistor 217 is off (i.e., highly resistive) and the node 218 presents a high trigger signal $V_{tr}$ to the gate of the NMOS transistor 210. In one embodiment, the trigger signal $V_{tr}$ stays high long enough to substantially discharge the ESD pulse through the discharge circuit 208.

Figure 2B:
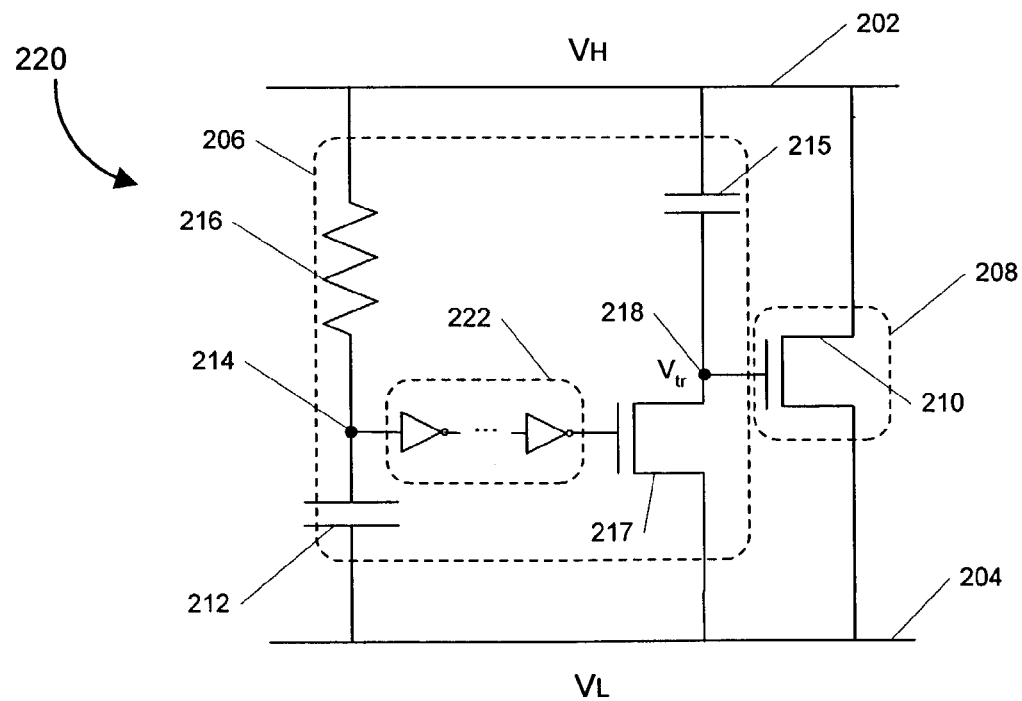

FIG. 2B illustrates an ESD protection circuit 220 in accordance with another embodiment of the present invention. The circuit 220 is identical to the circuit 200, except as follows. The trigger circuit 206 of the circuit 220 includes a delay stage 222, such as an even number of inverters arranged in series, connected between the gate of the transistor 217 and the node 214.

Figure 2C:
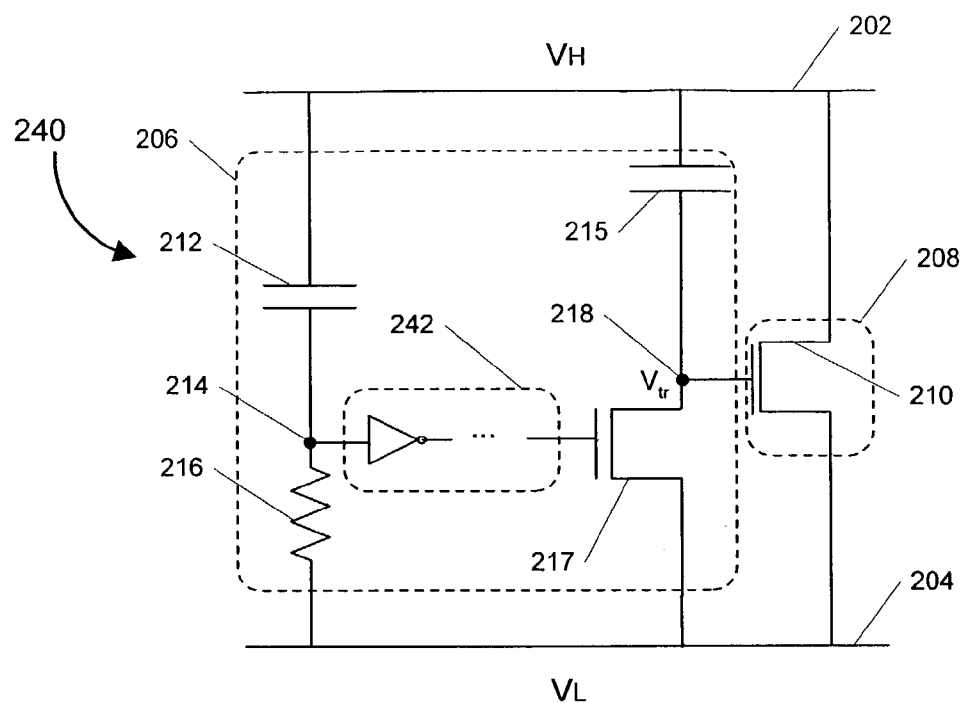

FIG. 2C illustrates an ESD protection circuit 240 in accordance with another embodiment of the present invention. The circuit 240 is identical to the circuit 200, except as follows. The capacitor 212 and the resistor 216 of the trigger circuit 206 of the circuit 240 are in reversed positions relative the positions of the circuit 200 of FIG. 2A. That is, in FIG. 2C, the capacitor 212 is connected between the high voltage pad 202 and the node 214 and the resistor 216 is connected between the low voltage pad 204 and the node 214. The trigger circuit 206 of the circuit 240 also includes a stage 242 that delays and inverts the signal at the node 214. As shown, the delay stage 242 may comprise a single inverter or an odd number of inverters.

Figure 2D:
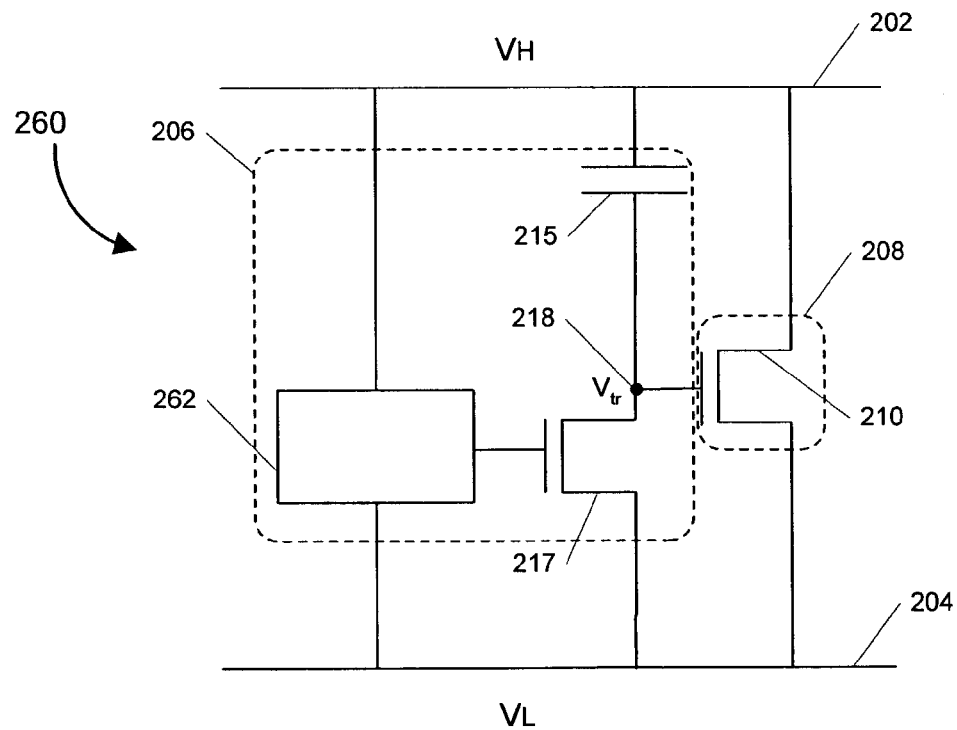

FIG. 2D illustrates an ESD protection circuit 260 in accordance with another embodiment of the present invention. The circuit 260 is identical to the circuit 200, except as follows. The trigger circuit 206 includes a delay circuit 262 connected between the high and low voltage pads 202, 204 and to the gate of the transistor 217 to hold the gate of the transistor 217 high during normal operation and to turn off the transistor 217 during an ESD event. The time constant of the delay circuit 262 may be in the range of about few hundred nanoseconds to a few microseconds. In some embodiments, the delay circuit 262 may comprise an RC delay circuit having resistive and capacitive elements.

Figure 3A:
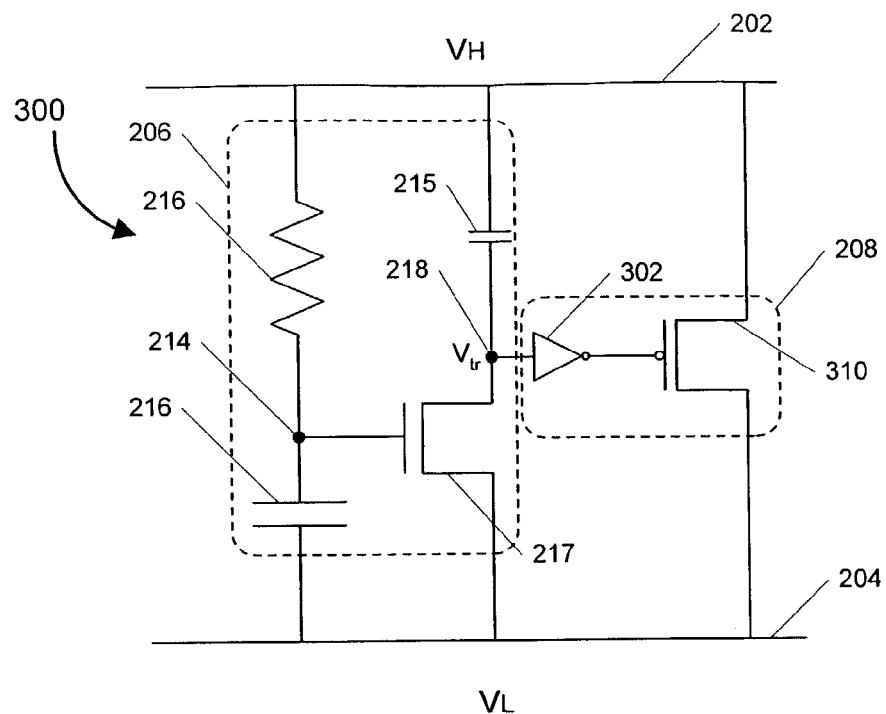
FIGS. 3A, 3B, and 3C illustrate ESD protection circuits in accordance with embodiments of the present invention.

FIG. 3A illustrates an ESD protection circuit 300 in accordance with another embodiment of the present invention. The circuit 300 is identical to the circuit 200, except as follows. The discharge circuit 208 of the circuit 300 includes a PMOS transistor 310 with a single inverter 302, or an odd number of inverters, connected between the gate of the PMOS transistor 310 and the node 218. The inverter 302 inverts the trigger signal $V_{tr}$. Alternatively, the inverter 302 may be replaced by an odd number of inverters arranged in series. Optionally, a PMP bipolar driver (not shown) may be used in the place of the PMOS transistor 310.

Figure 3B:
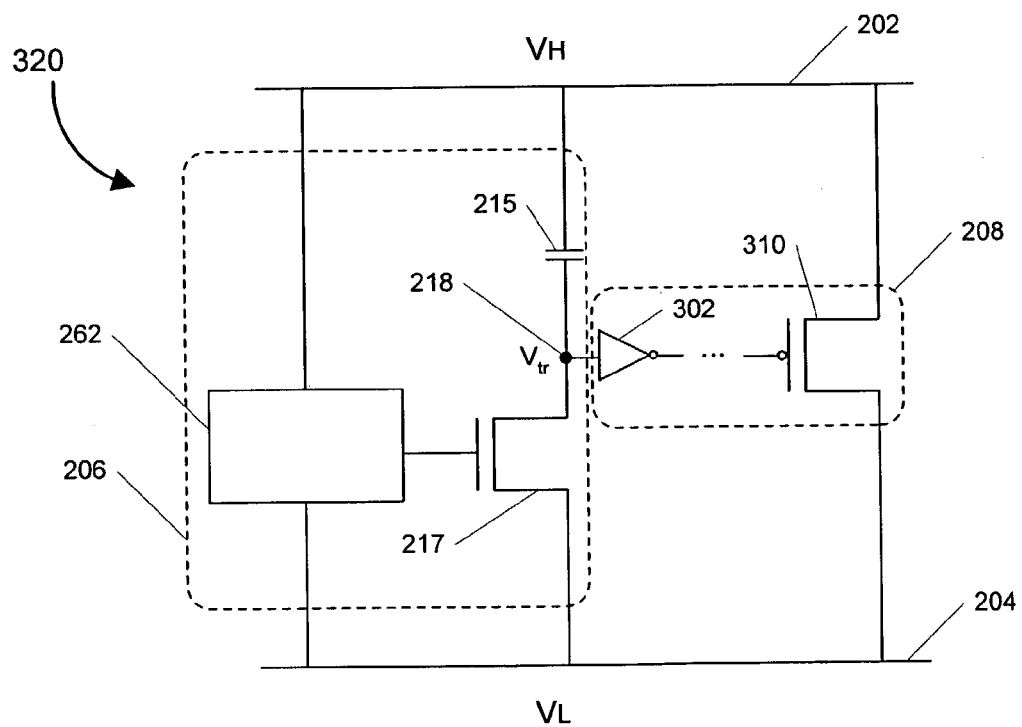

FIG. 3B illustrates an ESD protection circuit 320 in accordance with another embodiment of the present invention. The circuit 320 is identical to the circuit 300, except as follows. The trigger circuit 206 of the circuit 320 includes a delay circuit 262 connected between the high and low voltage pads 202, 204 and to the gate of the transistor 217 to hold the gate of the transistor 217 high during normal operation and to turn off the transistor 217 during an ESD event. The delay of the delay circuit 262 may be in the range of about few hundred nanoseconds to a few microseconds.

Figure 3C:
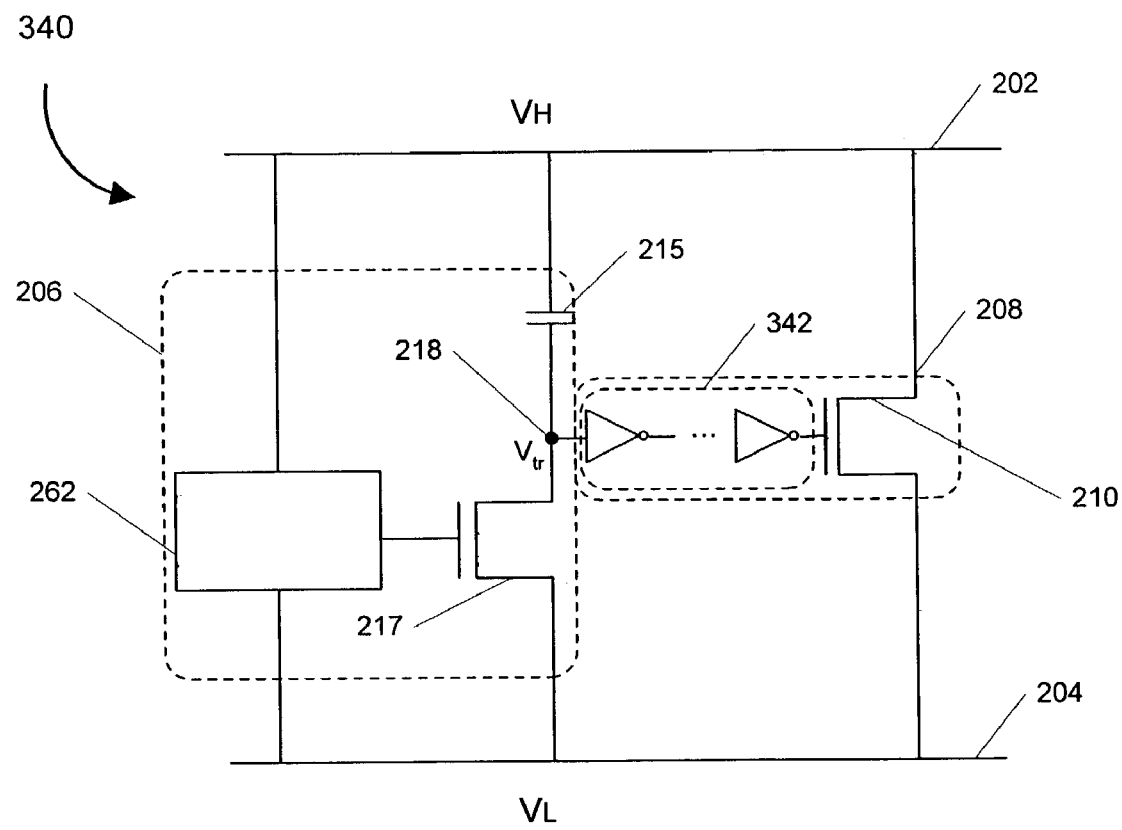

FIG. 3C illustrates an ESD protection circuit 340 in accordance with another embodiment of the present invention. The circuit 340 is identical to the circuit 320, except as follows. The discharge circuit 208 comprises an NMOS transistor 210, the terminals of which are coupled to the high and low voltage pads 202, 204 to selectively conduct current therebetween. A delay element 342 comprising an even number of inverters is connected between the node 218 and the gate of the NMOS transistor 210 to delay the trigger signal $V_{tr}$.

Figure 4A:
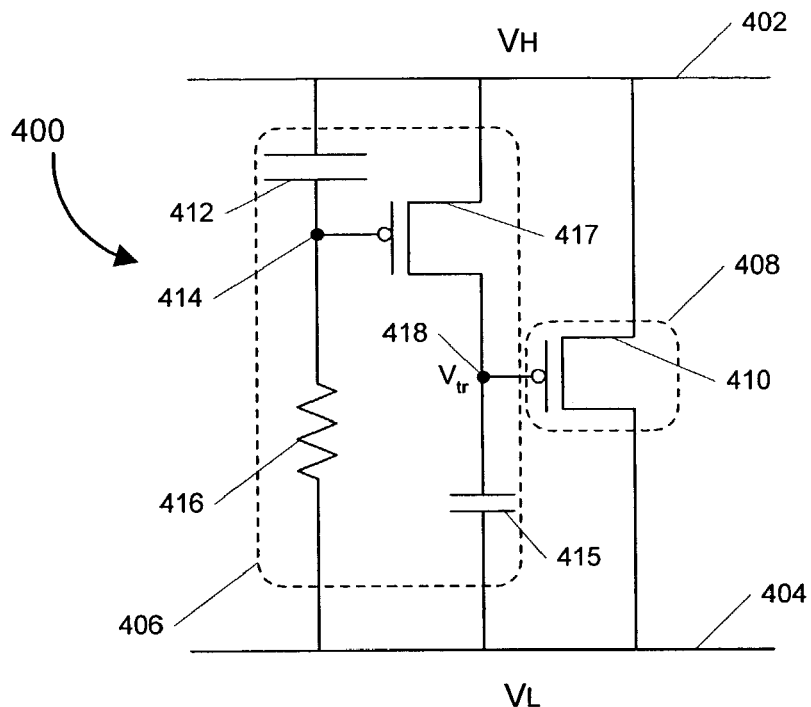
FIGS. 4A, 4B, 4C, and 4D illustrate ESD protection circuits in accordance with embodiments of the present invention.

FIG. 4A illustrates an ESD protection circuit 400 in accordance with another embodiment of the present invention. Power supply voltage or other voltage is supplied to an integrated circuit chip between high voltage pad 402 and low voltage pad 404.

The circuit 400 includes a trigger circuit 406 and a discharge circuit 408. The trigger circuit 406 is coupled between the high voltage pad 402 and the low voltage pad 404 and provides a trigger signal $V_{tr}$ at node 418 to the discharge circuit 408. The discharge circuit 408 conducts current between the high and low voltage pads 402, 404 in response to the trigger signal $V_{tr}$.

The discharge circuit 408 is also coupled between the high voltage pad 402 and the low voltage pad 404. In response to the trigger signal $V_{tr}$, the discharge circuit shunts charge from the high voltage pad 402 to the low voltage pad 404.

The discharge circuit 408 includes PMOS transistor 410. Optionally, a PNP driver (not shown) may be used in place of the PMOS transistor 410. Alternatively, the PMOS transistor 410 may be replaced with an odd number of inverters and either a NMOS transistor or NPN bipolar driver.

In an ESD event, the trigger circuit 406 alters the trigger signal $V_{tr}$ at the node 418 and turns on the discharge circuit 408. The trigger circuit 406 includes a capacitor 412 connected between the high voltage pad 402 and node 414 and a resistor 416 connected between the low voltage pad 404 and the node 414, with the capacitor 412 and the resistor 416 being arranged in series. The resistor 416 may comprise a transistor or other resistive element. The R*C range of the resistor 416 and the capacitor 412 is typically in the range of a few hundred nanoseconds to a few microseconds.

The trigger circuit 406 also includes a capacitor 415 and a PMOS transistor 417 arranged in series between the high and low voltage pads 402, 404. One terminal of the capacitor 415 is connected to the low voltage pad 404 and the other terminal of the capacitor 415 is connected to node 418. A terminal of the PMOS transistor 217 is connected to the node 218 and another terminal of the PMOS transistor 217 is connected to the high voltage pad 402. The gate terminal of the PMOS transistor 417 is connected to the node 214, which controls the PMOS transistor 417.

In normal operation, the PMOS transistor 417 is on, thereby holding the gate of the PMOS transistor 410 high by asserting a high trigger signal $V_{tr}$. This prevents the PMOS transistor 410 (or PNP driver) from turning on and conducting current between the high and low voltage pads 402, 404 during normal operation. The R*C time constant of the capacitor 215 and the transistor 217 in some embodiments is about 1 nanosecond or less. In other embodiments, the R*C time constant of the capacitor 215 and the transistor 217 is less than about 10 nanoseconds. During an ESD event, however, the voltage at node 414 goes high, thus turning off the PMOS transistor 417 and turning on the PMOS transistor 410 to shunt charge from the pad 402 to the pad 404 via the PMOS transistor 410.

Figure 4B:
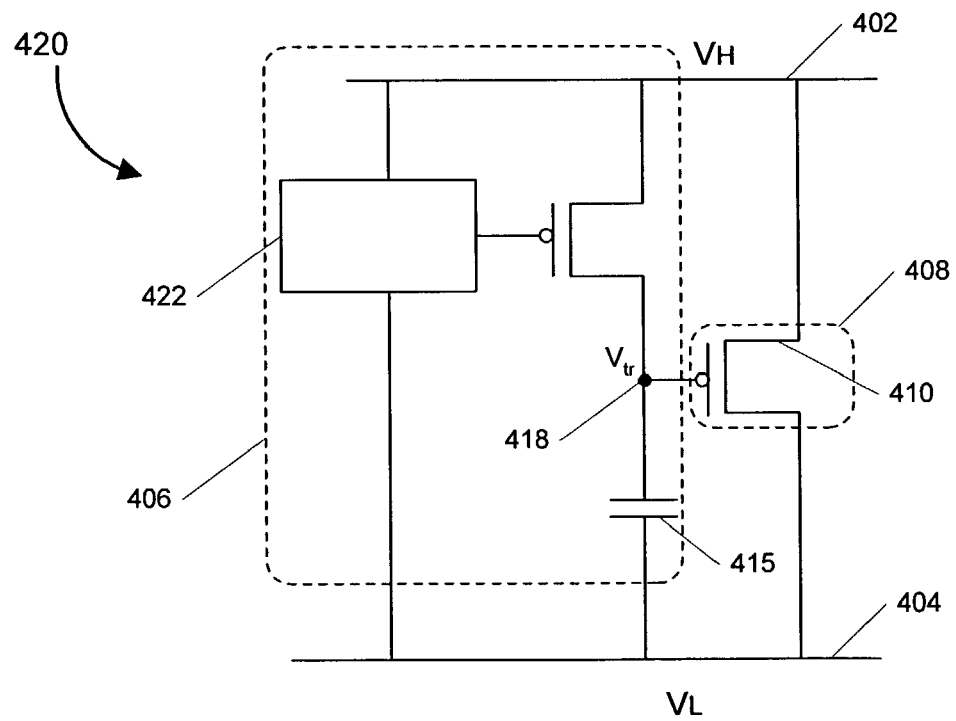

FIG. 4B illustrates an ESD protection circuit 420 in accordance with another embodiment of the present invention. The circuit 420 is identical to the circuit 400, except as follows. The trigger circuit 406 of the ESD protection circuit 420 includes a delay turn on circuit 422 in place of the resistor 416 and the capacitor 412 shown in FIG. 4A. The delay turn on circuit 422 may be identical to the delay turn on circuit 262 of FIG. 2D.

Figure 4C:
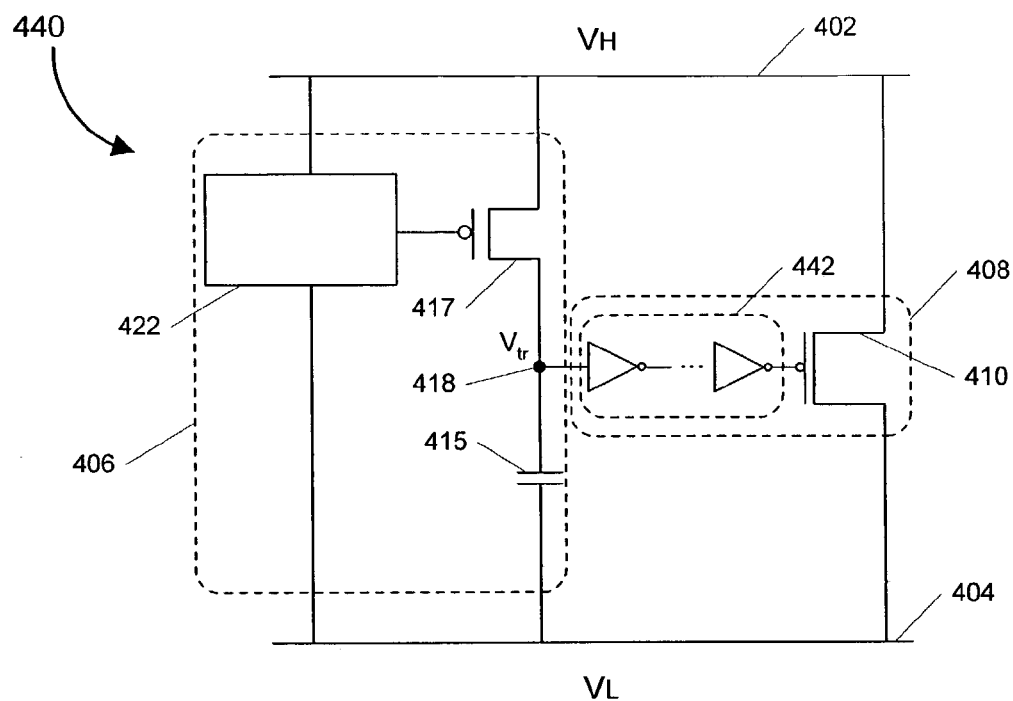

FIG. 4C illustrates an ESD protection circuit 440 in accordance with another embodiment of the present invention. The circuit 440 is identical to the circuit 420, except as follows. The discharge circuit 408 includes a delay element 442 connected between the node 418 and the gate of the PMOS transistor 410. The delay element 442 may comprise an even number of inverters connected in series or other suitable delay element.

Figure 4D:
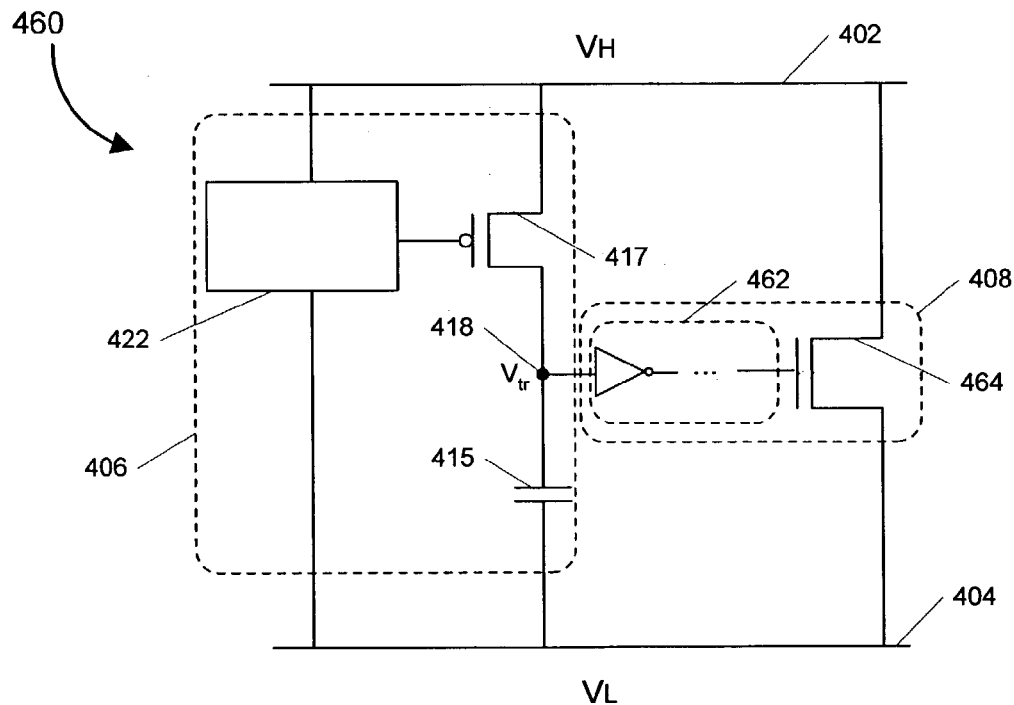

FIG. 4D illustrates an ESD protection circuit 460 in accordance with another embodiment of the present invention. The circuit 460 is identical to the circuit 440, except as follows. The discharge circuit 408 of the circuit 460 of FIG. 4D includes a delay element 462 in place of the delay element 442 of the circuit 440 of FIG. 4C. Also, the discharge circuit 408 of the circuit 460 of FIG. 4D includes an NMOS transistor 464 in place of the PMOS transistor 410 of the circuit 440 of FIG. 4C. The delay circuit 462 comprises an odd number of inverters and is connected between the node 418 and a gate of the NMOS transistor 464.

FIGS. 5A–8D illustrate embodiments including more than two independent DC pads $V_{H1}$, $V_{H2}$, and $V_L$. For example, the DC pads $V_{H1}$, $V_{H2}$, and $V_L$ may comprise $V_{CC1}$, $V_{CC2}$, and $V_{SS}$. Optionally, the DC pads $V_{H1}$, $V_{H2}$, and $V_L$ may comprise other independent DC voltage pads. These embodiments illustrate ESD protection circuits between $V_{H1}$ and $V_L$ wherein operation of a discharge circuit depends on whether $V_{H2}$ is high or low. During an EDS event (i.e., EDS zapping) between $V_{H1}$ and $V_L$, the voltage $V_{H2}$ is low. During normal operation, however, $V_{H2}$ powers up and is, therefore, high. Accordingly, the ESD circuits shown in FIGS. 5A–8D function as ESD protection circuits when $V_{H2}$ is low and are substantially disabled as ESD protection circuits when $V_{H2}$ is high. In this manner, the discharge circuits of the ESD protection circuits of these embodiments do not respond to high positive $V_{H1}$ spikes during normal operation and, thus, avoid unintentional current flow, thereby reducing unnecessary power loss and noise.

Figure 5A:
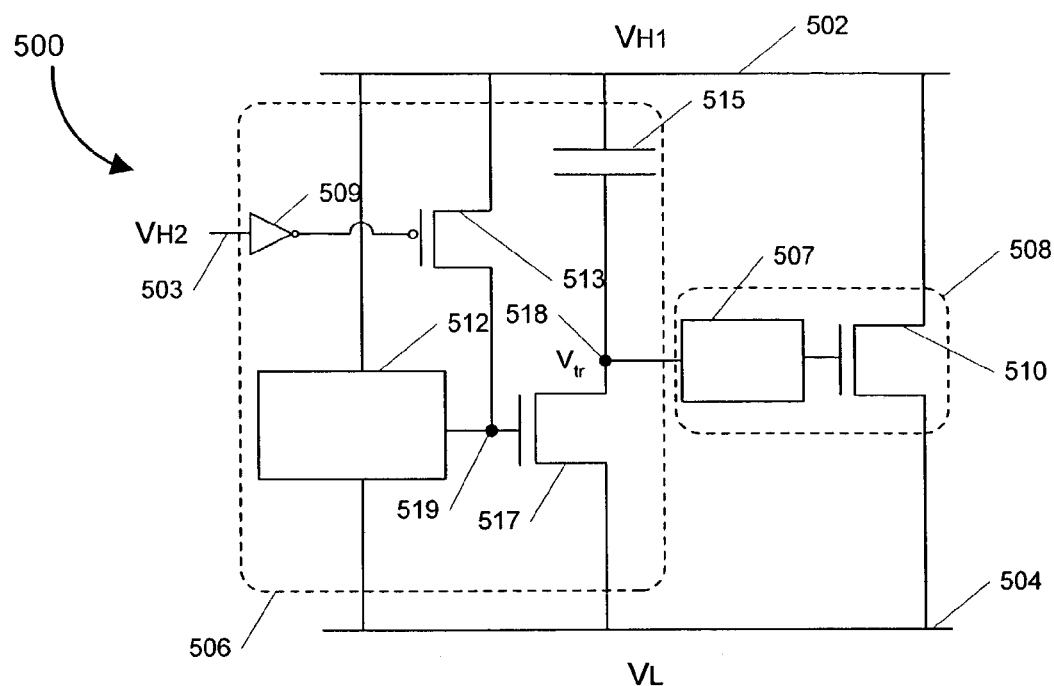
FIGS. 5A, 5B, 5C, and 5D illustrate ESD protection circuits in accordance with embodiments of the present invention.

FIG. 5A illustrates an ESD protection circuit 500 in accordance with an example embodiment. Voltages are supplied to an integrated circuit chip between first high voltage pad 502, second high voltage pad 503, and low voltage pad 504. The circuit 500 includes a trigger circuit 506 and a discharge circuit 508. The trigger circuit 506 is coupled between the pads 502, 503, and 504 and provides a trigger signal $V_{tr}$ at node 518 to the discharge circuit 508. The discharge circuit 508 conducts current between the DC pads 502, 504 in response to the trigger signal $V_{tr}$.

The discharge circuit 508 is also coupled between the pads 502, 504. In response to the trigger signal $V_{tr}$, the discharge circuit 508 shunts charge, such as an electrostatic discharge, from the pad 502 to the pad 504. The discharge circuit 508 includes an NMOS transistor 510 having terminals coupled to the pads 502, 504. Optionally, a NPN driver (not shown) may be used in place of the NMOS transistor 510. Alternatively, and as described below, the NMOS transistor 510 may be replaced with an odd number of inverters and either a PMOS transistor or PNP driver. In an ESD event, the trigger circuit 506 alters the trigger signal $V_{tr}$ at the node 518 and turns on the discharge circuit 508.

The trigger circuit 506 includes a capacitor 515 and a NMOS transistor 517 arranged in series between the voltage pads 502, 504. One terminal of the capacitor 515 is connected to the pad 502 and the other terminal of the capacitor 515 is connected to node 518. A terminal of the NMOS transistor 517 is connected to the node 518 and another terminal of the NMOS transistor 517 is connected to the pad 504. The gate terminal of the NMOS transistor 517 is connected to the node 519, which controls the NMOS transistor 517. A delay turn on circuit 512 is connected between the pads 502, 504 and the node 519. The delay turn on circuit 512 may be identical to the delay turn on circuit 262 of FIG. 2D.

PMOS transistor 513 comprises a portion of the trigger circuit 506 of the circuit 500 and has one terminal connected to the pad 502 and another terminal connected to the node 519. A gate of the PMOS transistor 513 is connected to pad 503 via inverter 509. The inverter 509 may alternatively comprise an odd number of inverters.

The discharge circuit 508 includes an NMOS transistor 510 with one terminal connected to the pad 502 and another terminal connected to the pad 504. The gate of the NMOS transistor 510 is controlled by the trigger signal $V_{tr}$ at the node 518. In the embodiment illustrated in FIG. 5A, a delay circuit 507 is connected between the gate of the NMOS transistor 510 and the node 518. The delay circuit 507 is optional, however, and may comprise an even number of inverters (not shown). That is, the gate of the transistor 510 may be connected directly to the node 518 without any intervening delay elements.

In normal operation, the voltage at pad 503 is high, which holds the gate of PMOS transistor 513 low, turning on the PMOS transistor 513. With the PMOS transistor 513 on (i.e., highly conductive), the voltage at node 519 is pulled high, turning on the NMOS transistor 517, which pulls the voltage at node 518 low. With the voltage at node 518 low, the trigger signal $V_{tr}$ is low, thus maintaining the NMOS transistor 510 off (i.e., highly resistive). Accordingly, the discharge circuit 508 is disabled when $V_{H2}$ is high.

During an ESD event, however, the voltage at pad 503 is low, which turns off the PMOS transistor 513. With the PMOS transistor 513 off (i.e., highly resistive), the voltage at node 519 is controlled by delay turn on circuit 512. Accordingly, in the circuit 500 of FIG. 5A, the discharge circuit 508 is disabled when $V_{H2}$ is high, but is turned on in response to an ESD event when $V_{H2}$ is low.

Figure 5B:
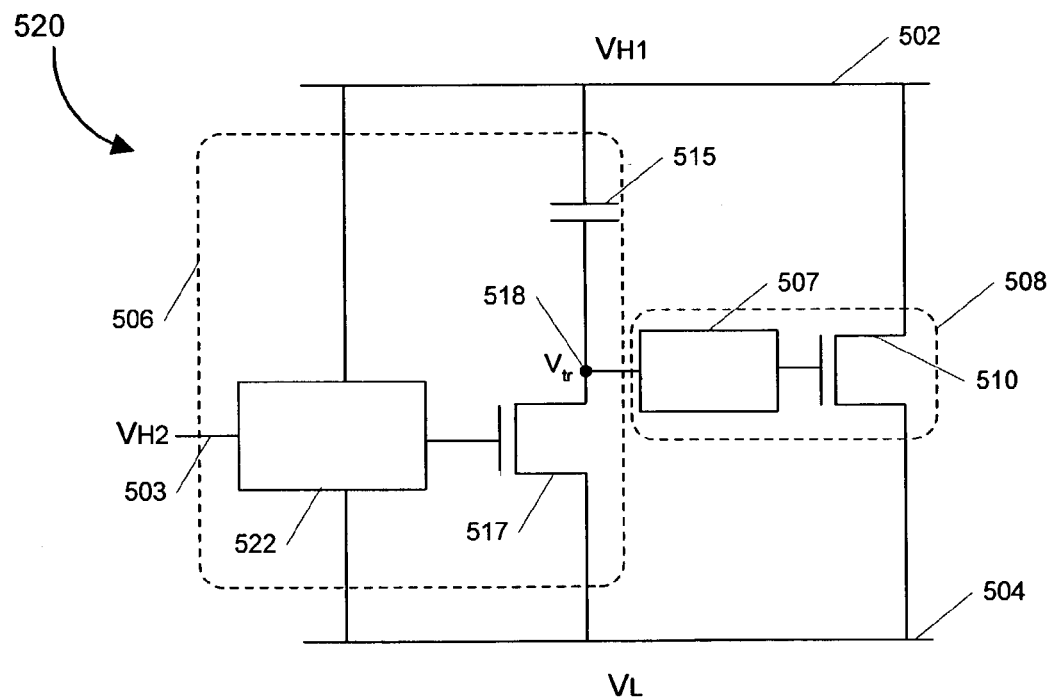

FIG. 5B illustrates an ESD protection circuit 520 in accordance with another embodiment of the present invention. The circuit 520 is identical to the circuit 500, except as follows. The trigger circuit 506 includes a variable delay turn on circuit 522 rather than the circuit 512 (FIG. 5A). The variable delay turn on circuit 522 is connected between the DC voltage pads 502, 503, and 504. When the voltage $V_{H2}$ at the pad 503 is low, the circuit 522 has a first delay time and when the voltage $V_{H2}$ at the pad 504 is high, the circuit 522 has a second delay time, the second delay time being shorter than the first delay time.

Figure 9:
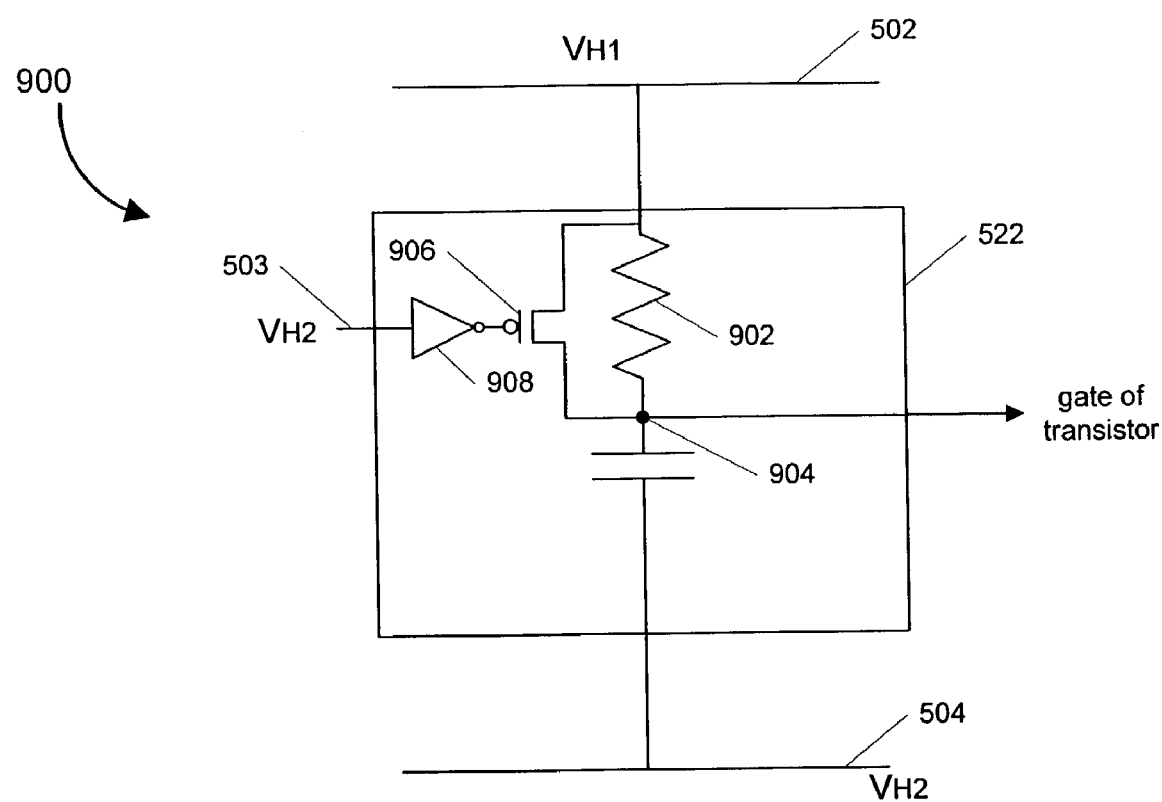
FIG. 9 illustrates an example embodiment of a variable delay turn on circuit in accordance with embodiments of the present invention.

FIG. 9 illustrates details of one example embodiment of the variable delay turn on circuit 522 (FIG. 5B). As shown in FIG. 9, one embodiment of the variable delay turn on circuit 522 includes a resistor 902 connected between the pad 502 and a node 904. A capacitor 905 is connected between the pad 504 and the node 904. A PMOS transistor 906 has one terminal connected to the pad 502 and the other terminal connected to the node 904. A gate of the PMOS transistor 906 is controlled by the voltage $V_{H2}$ at the node 503 via an inverter 908. The variable turn on circuit 522 shown in FIG. 9, therefore, has a first delay when the voltage $V_{H2}$ is low and the PMOS transistor 906 is on (i.e., highly conductive) and a second delay when the voltage $V_{H2}$ is high and the PMOS transistor is off (i.e., highly resistive). When $V_{H2}$ is low, the circuit 522 has a longer time constant than when $V_{H2}$ is high. The circuit 522 of FIG. 9 may be modified by replacing the PMOS transistor 906 with an NMOS transistor (not shown) and connecting the gate of the NMOS transistor to $V_{H2}$ without the inverter 509.

Figure 5C:
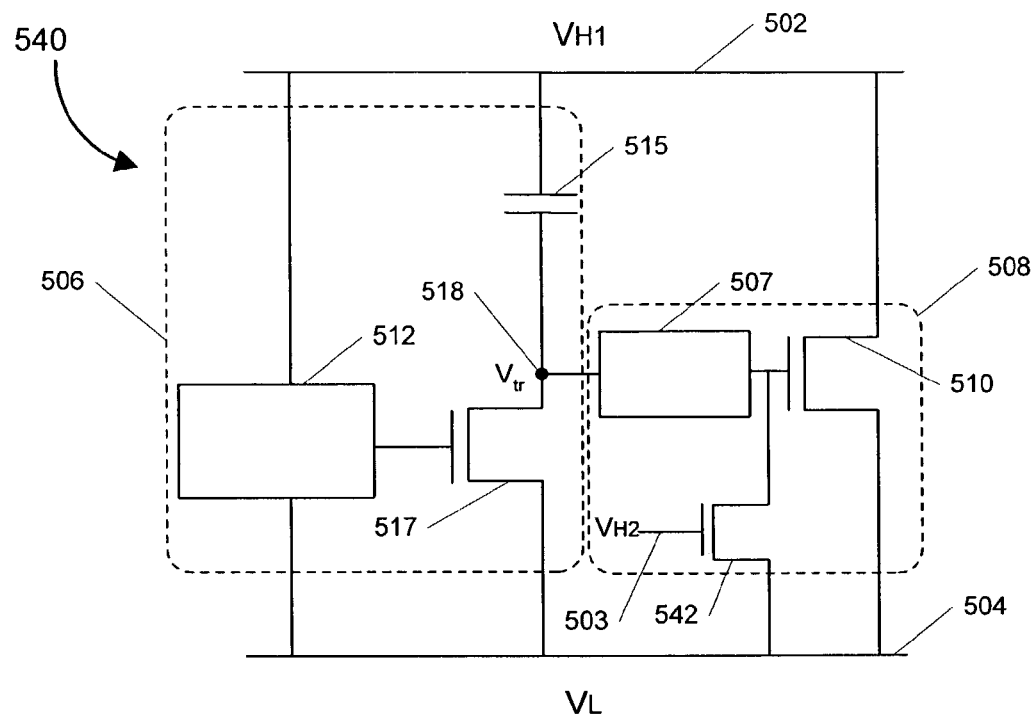

Referring now to FIG. 5C, FIG. 5C illustrates an ESD protection circuit 540 in accordance with another embodiment of the present invention. The circuit 540 is identical to the circuit 500, except as follows. The trigger circuit 506 of the circuit 540 does not include the PMOS transistor 513 or the inverter 509 shown in FIG. 5A. The discharge circuit 508 of FIG. 5C includes NMOS transistor 542 with one terminal connected to the pad 504 and the other terminal connected to the gate of the NMOS transistor 510. The gate of the NMOS transistor 542 is controlled by $V_{H2}$ at the pad 503. When the voltage $V_{H2}$ at the pad 503 is high, the transistor 542 pulls the gate of the transistor 510 low, thus maintaining the transistor 510 off (i.e., highly resistive). When the voltage $V_{H2}$ at the pad 503 is low, however, the transistor 542 the gate of the transistor 510 is controlled by the node 518.

Figure 5D:
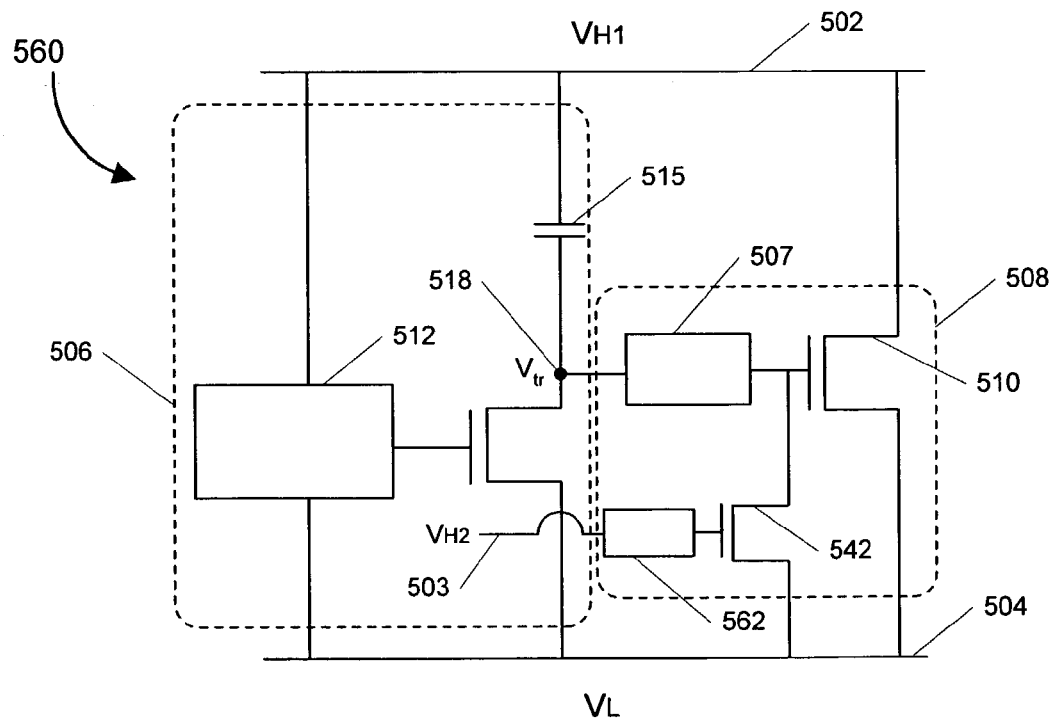

FIG. 5D illustrates an ESD protection circuit 560 in accordance with another embodiment of the present invention. The circuit 560 is identical to the circuit 540, except as follows. The circuit 560 includes a delay element 562 between the pad 503 and the gate of the transistor 542. The delay element 562 may comprise an even number of inverters arranged in series.

Figure 6A:
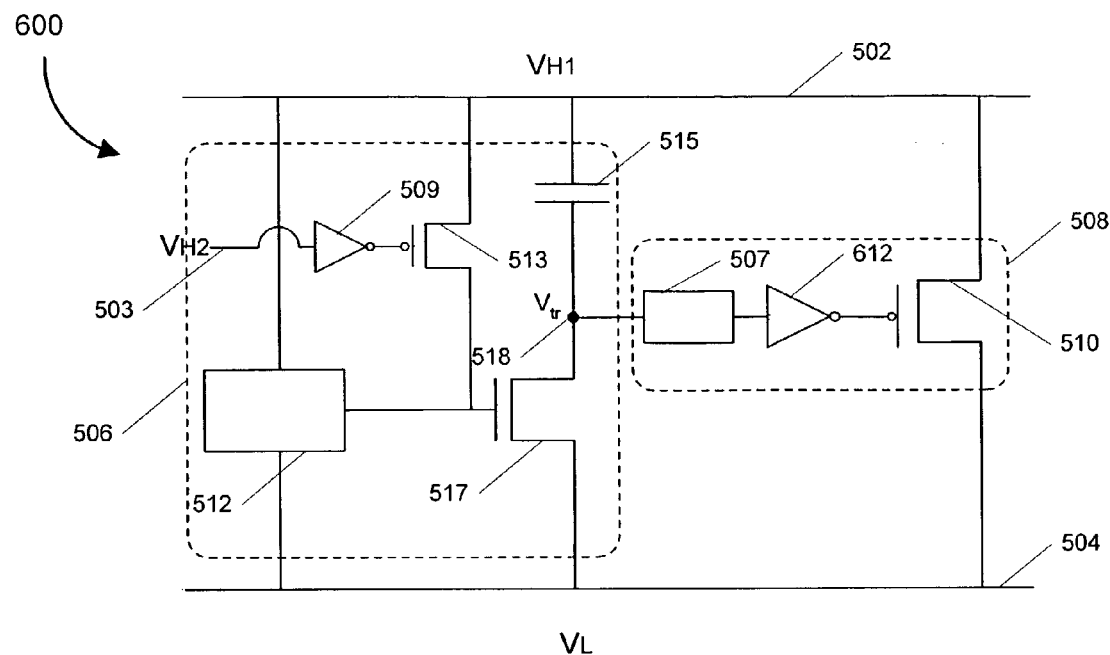
FIGS. 6A, 6B, 6C, and 6D illustrate ESD protection circuits in accordance with embodiments of the present invention.

FIG. 6A illustrates an ESD protection circuit 600 in accordance with another embodiment of the present invention. The circuit 600 is identical to the circuit 500 of FIG. 5A, except as follows. The discharge circuit 508 includes a PMOS transistor 610 in place of the NMOS transistor 510 (FIG. 5A). The gate of the PMOS transistor 610 is controlled by the trigger signal $V_{tr}$ at the node 518 as inverted by the inverter 612.

Figure 6B:
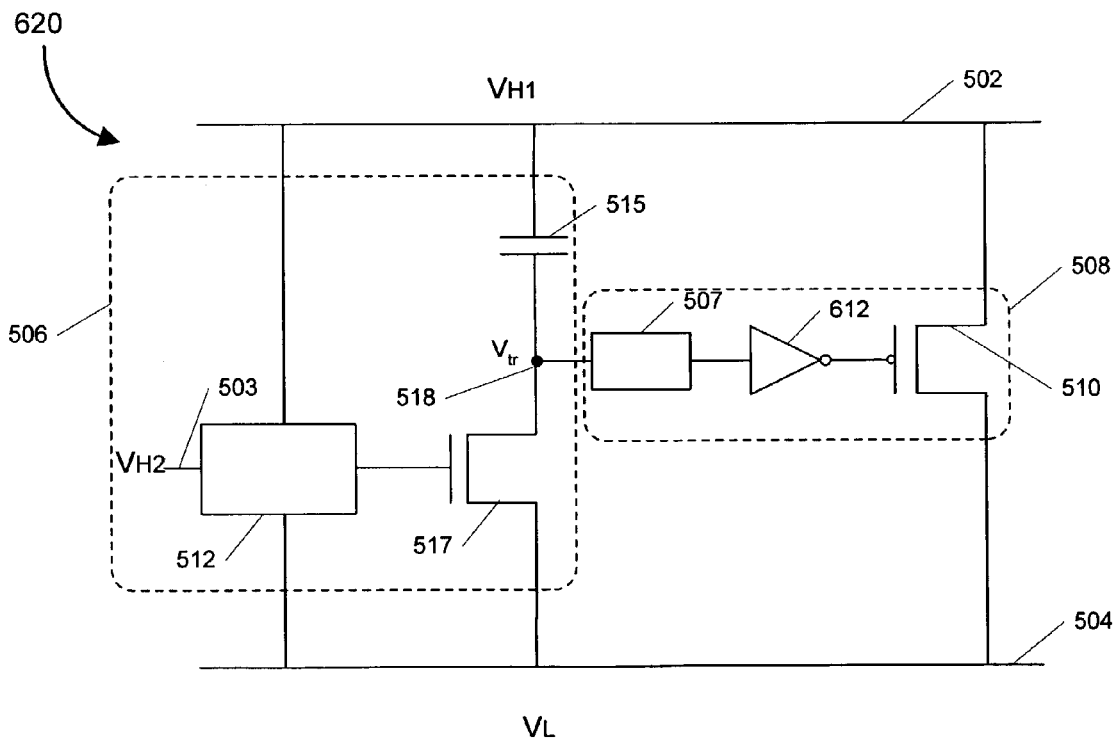

FIG. 6B illustrates an ESD protection circuit 620 in accordance with another embodiment of the present invention. The circuit 620 is identical to the circuit 520 of FIG. 5B, except as follows. The discharge circuit 508 includes a PMOS transistor 610 in place of the NMOS transistor 510 (FIG. 5B). The gate of the PMOS transistor 610 is controlled by the trigger signal $V_{tr}$ at the node 518 as inverted by the inverter 612.

Figure 6C:
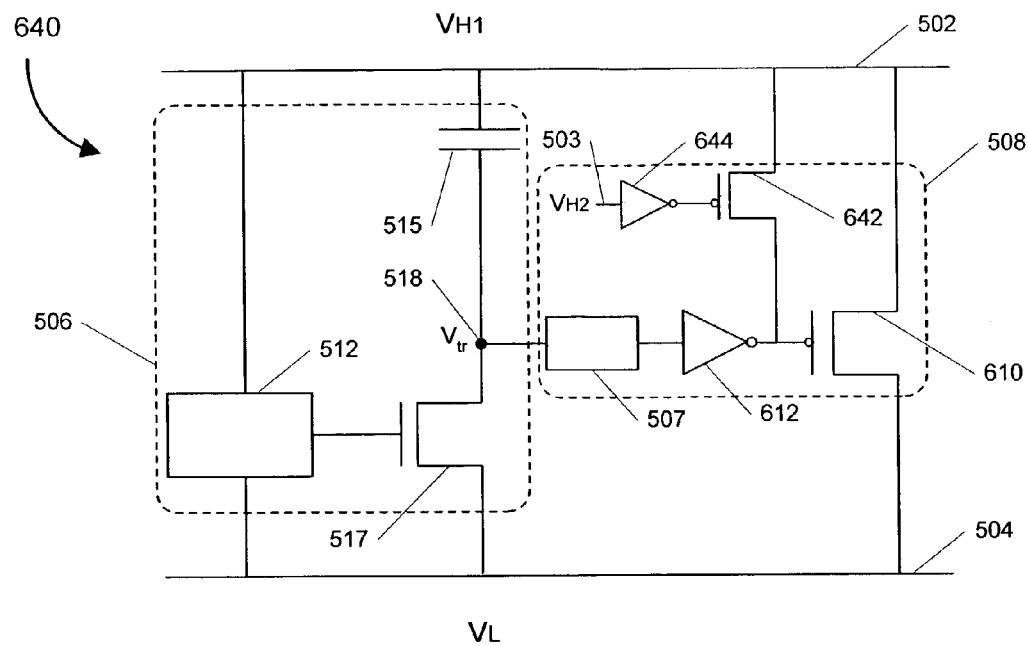

FIG. 6C illustrates an ESD protection circuit 640 in accordance with another embodiment of the present invention. The circuit 640 is identical to the circuit 540 of FIG. 5C, except as follows. The discharge circuit 508 includes an inverter 612 in series with a gate of a PMOS transistor 610 in place of the NMOS transistor 510 (FIG. 5B). In addition, the transistor 542 of FIG. 5C is replaced with PMOS transistor 642 connected between the gate of the PMOS transistor 610 and the pad 502. The gate of the PMOS transistor 642 is controlled by the output of an inverter 644, which has an input connected to pad 503 to receive VH2. The gate of the PMOS transistor 610 is controlled by the trigger signal $V_{tr}$ at the node 518 as inverted by the inverter 612 when $V_{H2}$ is low. When $V_{H2}$ is high, however, the gate of the PMOS transistor 610 is held high by the PMOS transistor 642, thus maintaining the PMOS transistor 610 off (i.e., highly resistive).

Figure 6D:
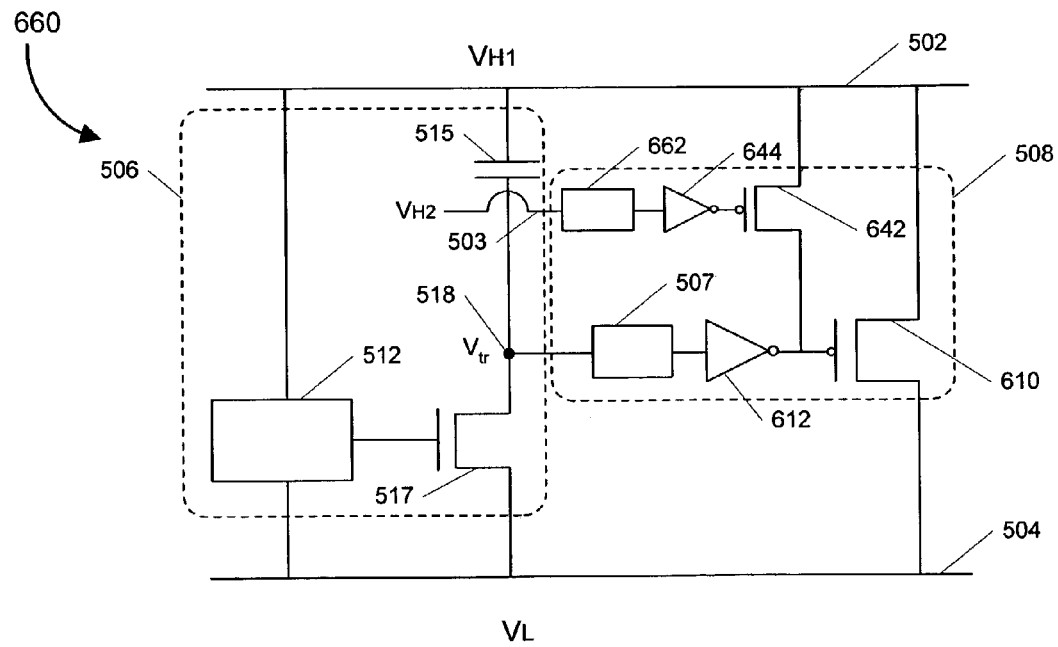

FIG. 6D illustrates an ESD protection circuit 660 in accordance with another embodiment of the present invention. The circuit 660 is identical to the circuit 640, except as follows. The circuit 660 includes a delay element 662 between the pad 503 and the input of inverter 644. The delay element 562 may comprise an even number of inverters arranged in series.

Figure 7A:
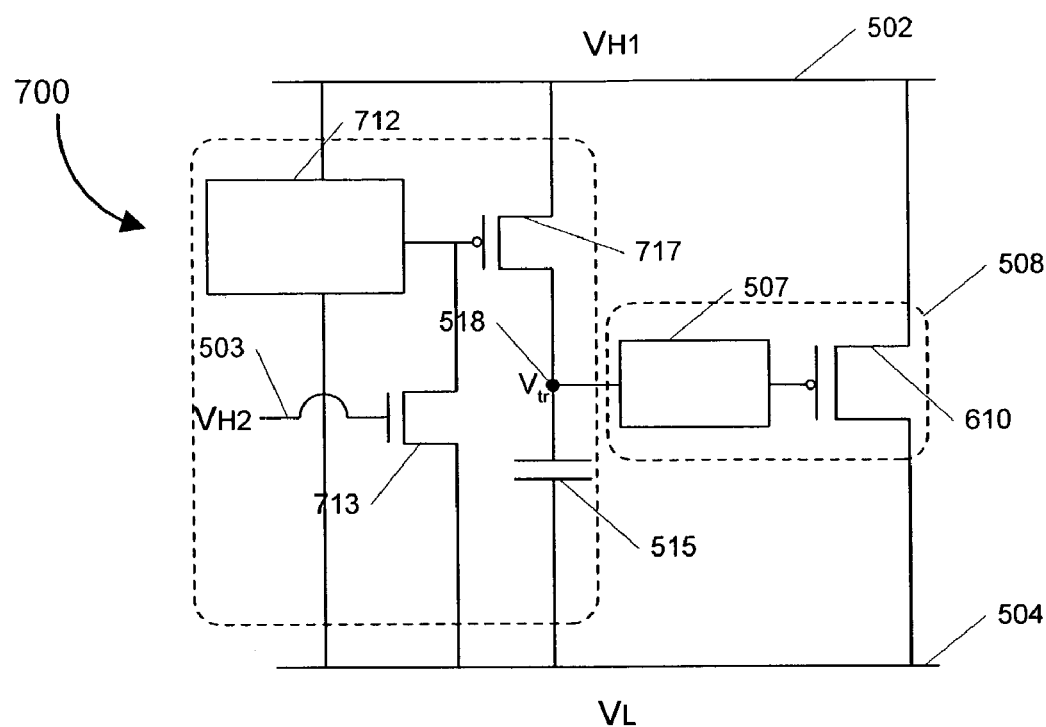
FIGS. 7A, 7B, 7C, and 7D illustrate ESD protection circuits in accordance with embodiments of the present invention.

FIG. 7A illustrates an ESD protection circuit 700 in accordance with another embodiment of the present invention. The circuit 700 of FIG. 7A is identical to the circuit 600 (FIG. 6A), except as follows. The discharge circuit 508 of the circuit 700 does not include the inverter 612 (FIG. 6A). Thus, the gate of the PMOS transistor 610 is connected to the node 518 via the delay element 507. Alternatively, the gate of the PMOS transistor 610 may be directly connected to the node 518, without passing through a delay element. The trigger circuit 506 includes the capacitor 515 connected between pad 504 and the node 518 and a PMOS transistor 717 with one terminal connected to the pad 502 and with the other terminal connected to the node 518 and does not include the NMOS transistor 517 (FIG. 6A).

The trigger circuit 506 of the circuit 700 includes a NMOS transistor 713 with one terminal connected to the pad 504 and the other terminal connected to the gate of the PMOS transistor 717. A gate of the NMOS transistor 713 is connected to and controlled by $V_{H2}$ at pad 503. In operation, when $V_{H2}$ is high, the NMOS transistor 713 is on (i.e., highly conductive) and holds the gate of the PMOS transistor 717 low, thus maintaining the PMOS transistor 717 on while $V_{H2}$ is high. With the PMOS transistor 717 on, the trigger signal $V_{tr}$ at node 518 is held high, thus maintaining off the PMOS transistor 610. Hence, when $V_{H2}$ is high, the discharge circuit 508 is highly resistive and does not shunt charge from pad 502 to pad 504.

When $V_{H2}$ is low, however, the NMOS transistor 713 is off (i.e., highly resistive) and, as a result, the gate of the PMOS transistor 717 is controlled by the delay circuit 712, which may comprise an RC delay circuit having a time constant in the range of a few hundred nanoseconds to a few microseconds. Thus, during an ESD event, the delay circuit 712 turns off the PMOS transistor 717, causing the PMOS transistor 610 to turn on and to shunt charge from the pad 502 to the pad 504.

Figure 7B:
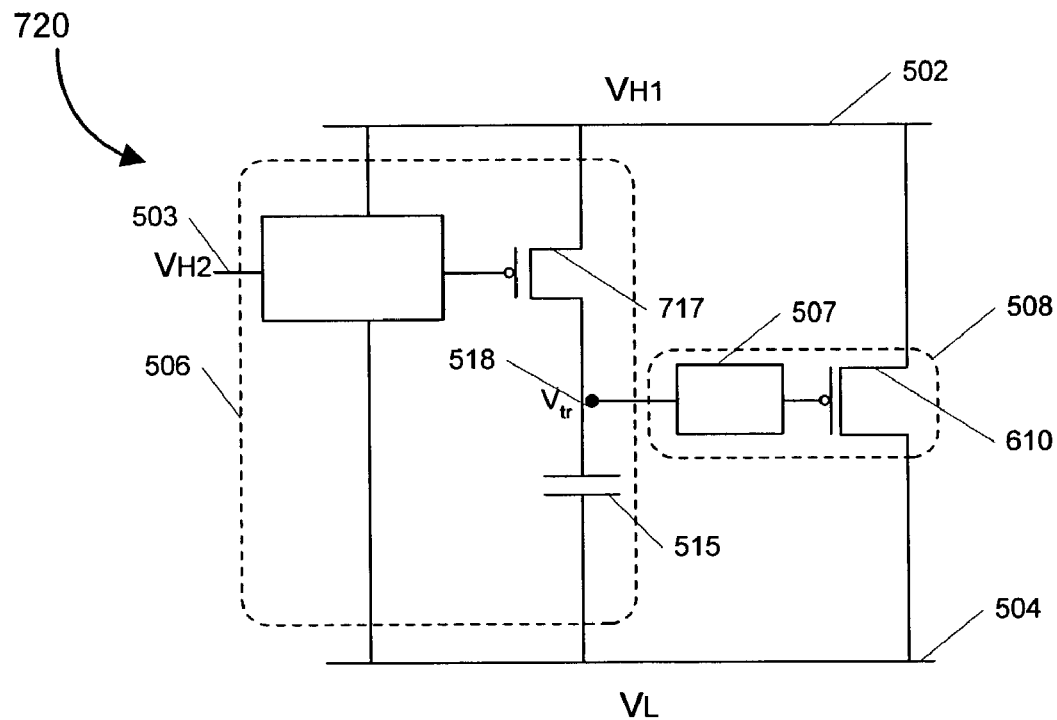

FIG. 7B illustrates an ESD protection circuit 720 in accordance with another embodiment of the present invention. The circuit 720 is identical to the circuit 700 of FIG. 7A, except as follows. The NMOS transistor 713 is not present in the circuit 720 and the gate of the PMOS transistor 717 is controlled via a variable delay circuit 722, which has a first delay when $V_{H2}$ is high and another, different, delay when $V_{H2}$ is low. In one embodiment, the variable delay circuit 722 is configured identical to the variable delay circuit 522 shown in FIG. 9 and described herein.

Figure 7C:
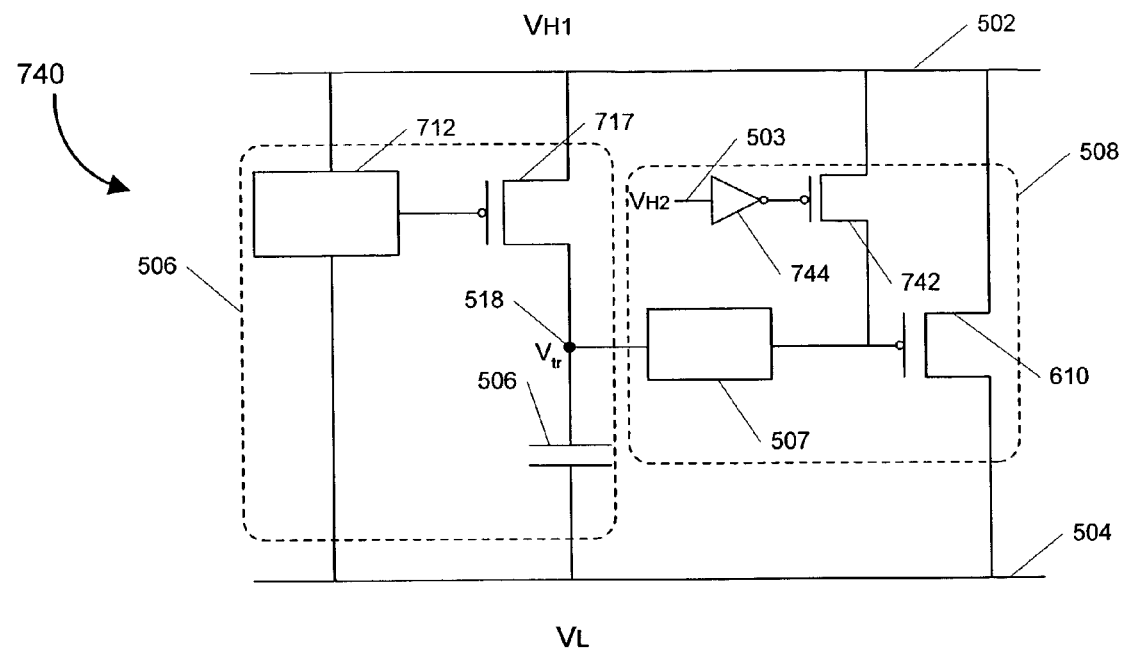

FIG. 7C illustrates an ESD protection circuit 740 in accordance with another embodiment of the present invention. The circuit 740 is identical to the circuit 700 of FIG. 7A, except as follows. The NMOS transistor 713 is not present in the circuit 720 and the gate of the PMOS transistor 717 is controlled by the delay circuit 712. In this embodiment, a PMOS transistor 742 is connected between the gate of the PMOS transistor 610 and the pad 502. The voltage $V_{H2}$ at pad 503 is connected to an input terminal of inverter 744. An output terminal of the inverter 744 is connected to and controls the gate of the PMOS transistor 742. Accordingly, when $V_{H2}$ is high, the inverter 744 asserts a low voltage at the gate of the PMOS transistor 742, thereby turning on the PMOS-transistor 742, which causes the gate of the PMOS transistor 610 to be held high at $V_{H1}$. Thus, when $V_{H2}$ is high, the discharge circuit 508 of the circuit 740 is disabled and does not shunt charge from the pad 502 to the pad 504. When $V_{H2}$ is low, however, the transistor 742 is off (i.e., highly resistive) and the gate of the PMOS transistor 610 is controlled by the trigger signal $V_{tr}$ at the node 518 in a manner similar to that shown in FIG. 4B and described above.

Figure 7D:
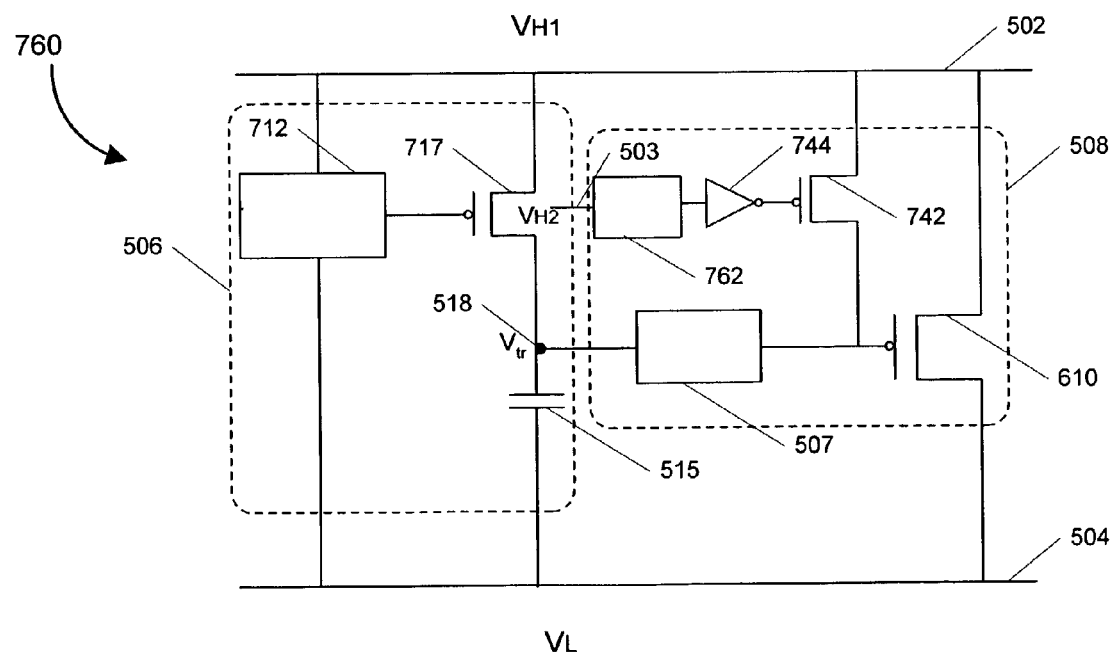

FIG. 7D illustrates an ESD protection circuit 760 in accordance with another embodiment of the present invention. The circuit 760 is identical to the circuit 740 of FIG. 7C, except as follows. The circuit 760 includes a delay element 762 positioned between the pad 503 and the input of the inverter 744. The delay element 762 may comprise an even number of inverters arranged in series or other suitable delay element.

Figure 8A:
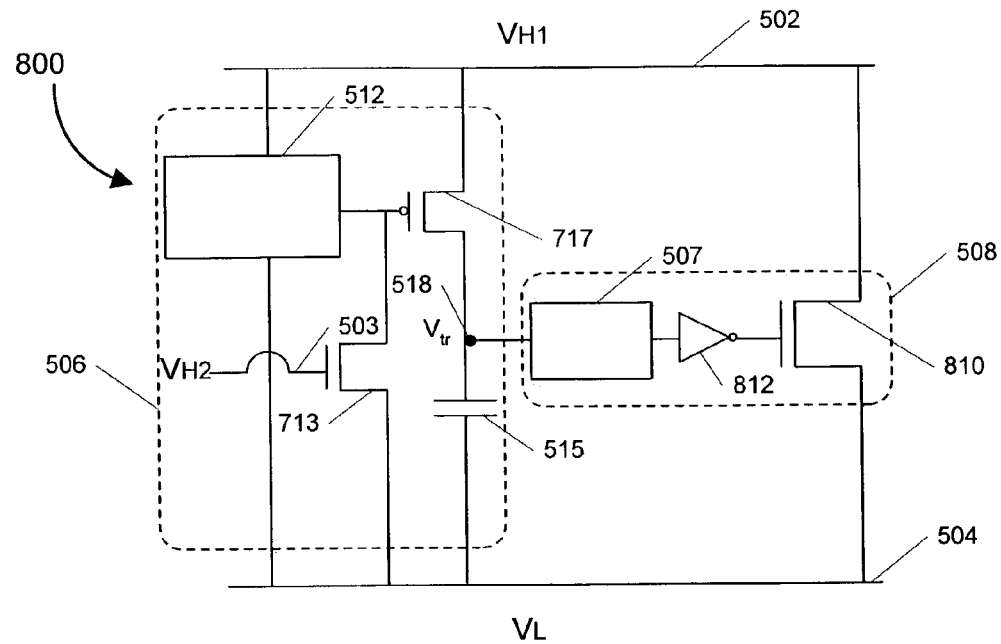
FIGS. 8A, 8B, 8C, and 8D illustrate ESD protection circuits in accordance with embodiments of the present invention.

FIG. 8A illustrates an ESD protection circuit 800 in accordance with another embodiment. The circuit 800 is identical to the circuit 700 (FIG. 7A), except as follows. The PMOS transistor 610 of FIG. 7A is replaced by an NMOS transistor 810 and an inverter 812. The output of the inverter 712 is connected to and controls the gate of the NMOS transistor 710. The input of the inverter 712 is connected to node 518 and receives the trigger signal $V_{tr}$.

Figure 8B:
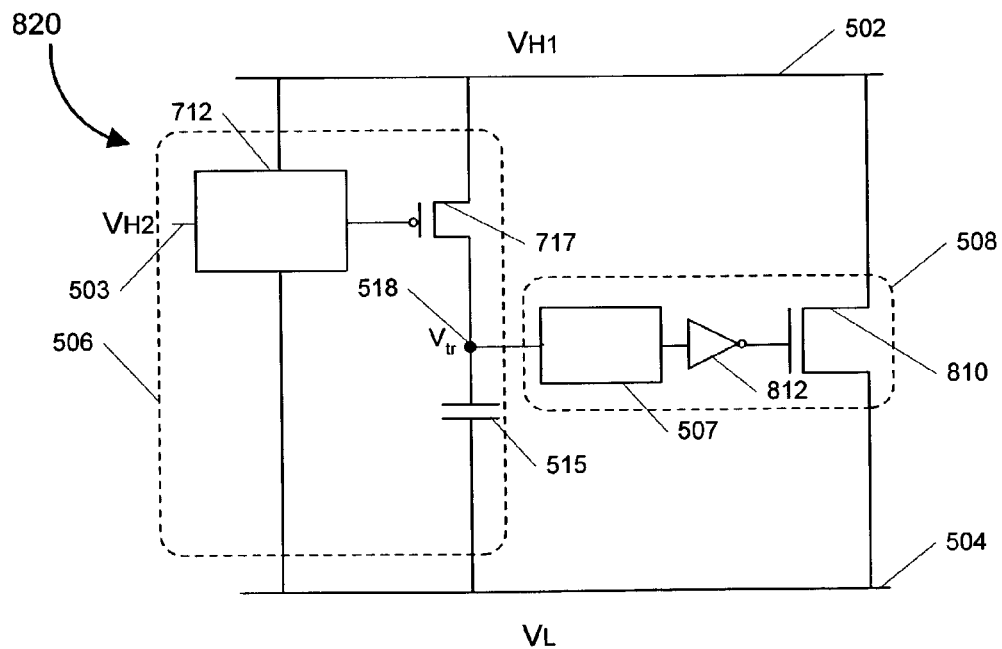

FIG. 8B illustrates an ESD protection circuit 820 in accordance with another embodiment. The circuit 820 is identical to the circuit 720 (FIG. 7B), except as follows. The PMOS transistor 610 of FIG. 7B is replaced by an NMOS transistor 810 and an inverter 712. The output of the inverter 712 is connected to and controls the gate of the NMOS transistor 810. The input of the inverter 712 is connected to node 518 and receives the trigger signal $V_{tr}$.

Figure 8C:
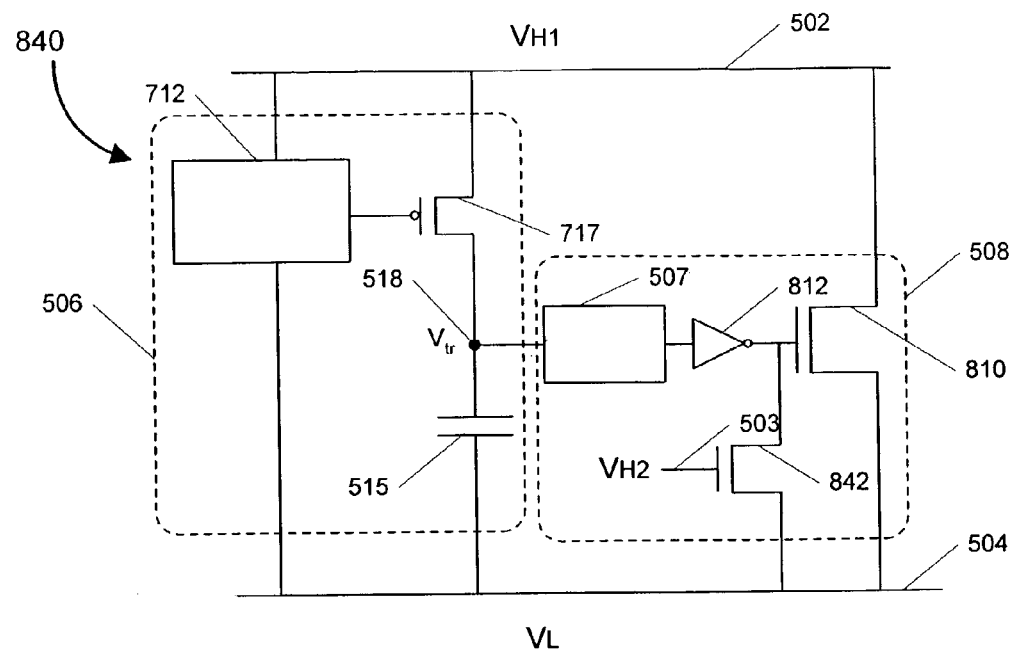

FIG. 8C illustrates an ESD protection circuit 840 in accordance with another embodiment. The circuit 840 is identical to the circuit 740 (FIG. 7C), except as follows. The PMOS transistor 610 of FIG. 7C is replaced by an NMOS transistor 810 and an inverter 712. The output of the inverter 712 is connected to and controls the gate of the NMOS transistor 810. The input of the inverter 712 is connected to node 518 and receives the trigger signal $V_{tr}$. The PMOS transistor 742 and the inverter 744 are not present in the circuit 840. Instead, an NMOS transistor 842 is connected between the gate of the NMOS transistor 810 and the pad 504 with the gate of the NMOS transistor 842 being controlled by VH2. When $V_{H2}$ is high, the NMOS transistor 842 is on (i.e., highly conductive) and holds the gate of the NMOS transistor 810 low to prevent the NMOS transistor 810 from turning on when $V_{H2}$ is high. When $V_{H2}$ is low, the NMOS transistor 842 is off (i.e., highly resistive) and the gate of the NMOS transistor 810 is controlled by the trigger signal $V_{tr}$ at the node 518.

Figure 8D:
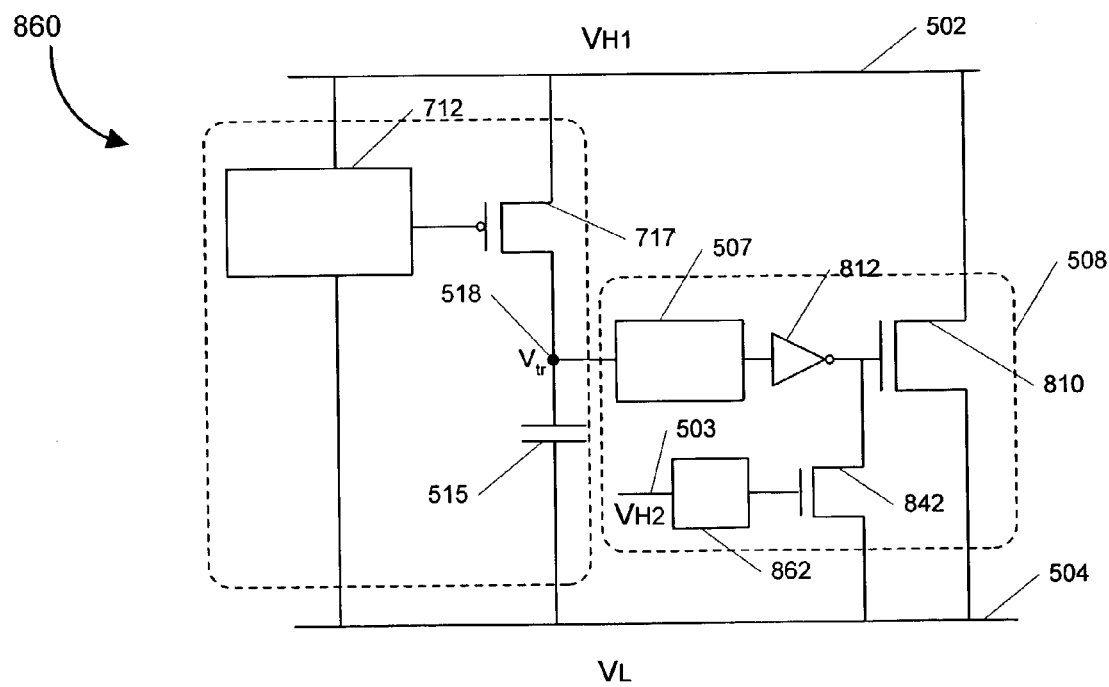

FIG. 8D illustrates an ESD protection circuit 860 in accordance with another embodiment. The circuit 860 is identical to the circuit 840 (FIG. 7C), except as follows. A delay element 862 is connected between the pad 503 and the gate of the NMOS transistor 810. The delay element 862 may comprise an even number of inverters or other suitable delay element.

This disclosure provides exemplary embodiments of the present invention. The scope of the present invention is not limited by these exemplary embodiments. Numerous variations, whether explicitly provided for by this disclosure or implied by this disclosure, may be implemented by one of ordinary skill in the art in view of this disclosure.

What is claimed is:

1. An electrostatic discharge (ESD) protection circuit comprising:
a trigger circuit coupled between a first DC pad and a second DC pad, the trigger circuit generating a trigger signal in response to a voltage spike on the first or second DC pad when no DC voltage is present between the first and second DC pads, the trigger circuit not generating a trigger signal in response to a voltage spike on the first or second DC pad when a DC voltage is present between the first and second DC pads, wherein the trigger circuit further comprises a first transistor in series with a capacitor, forming a series circuit coupled between the first and second DC pads; and
a discharge circuit coupled to the trigger circuit to receive the trigger signal, the discharge circuit conducting current between the first and second DC pads in response to the trigger signal.

2. The electrostatic discharge (ESD) protection circuit of claim 1, wherein a delay circuit controls a gate of the first transistor.

3. The electrostatic discharge (ESD) protection circuit of claim 2, wherein a time constant of the first transistor and the capacitor is less than about 1 nanosecond and a time constant of the delay circuit is greater than about 100 nanoseconds.

4. The electrostatic discharge (ESD) protection circuit of claim 1, wherein the first transistor comprises an NMOS transistor or a PMOS transistor.

5. The electrostatic discharge (ESD) protection circuit of claim 1, wherein the discharge circuit comprises a second transistor with source and drain terminals connected between the first and second DC pads.

6. The electrostatic discharge (ESD) protection circuit of claim 5, further comprising:
a third DC pad;
a third transistor connected between either the first or the second DC pad and a gate of the second transistor.

7. The electrostatic discharge (ESD) protection circuit of claim 1, further comprising at least one delay stage disposed between the trigger circuit and the discharge circuit.

8. The electrostatic discharge (BSD) protection circuit of claim 1, wherein the trigger circuit further comprises a delay circuit connected to a gate of the first transistor through at least one delay stage.

9. The electrostatic discharge (ESD) protection circuit of claim 1, further comprising:
a third DC pad coupled to the discharge circuit;
the discharge circuit configured to not conduct current between the first and second pads in response to signal on the third DC pad.

10. The electrostatic discharge (ESD) protection circuit of claim 1, further comprising:
a third DC pad;
a second transistor between either the first or the second DC pad and a gate of the first transistor.

11. The electrostatic discharge (ESD) protection circuit of claim 1, further comprising:
a third DC pad;
a variable delay circuit between the first and second DC pads and the third DC pad, a gate of the first transistor being controlled by the variable delay circuit, wherein the delay of the variable delay signal depends on a signal on the third DC pad.

12. The electrostatic discharge (ESD) protection circuit of claim 1, wherein the discharge circuit comprises an NPN driver or a PNP driver with terminals connected between the first and second DC pads and driven by the trigger signal.

13. An electrostatic discharge (ESD) protection circuit, comprising:
a trigger circuit coupled between a first DC pad and a second DC pad, the trigger circuit generating a trigger signal in response to a voltage spike on the first or second DC pad when no DC voltage is present between the first and second DC pads, the trigger circuit not generating a trigger signal in response to a voltage spike on the first or second DC pad when a DC voltage is present between the first and second DC pads;
a discharge circuit coupled to the trigger circuit to receive the trigger signal, the discharge circuit conducting current between the first and second DC pads in response to the trigger signal;
a third DC pad coupled to the trigger circuit;
the trigger circuit configured to not generate the trigger signal in response to signal on the third DC pad.

14. An electrostatic discharge (ESD) protection circuit, comprising:
a trigger circuit coupled between a first DC pad and a second DC pad to detect an ESD event, the trigger circuit comprising a first transistor in series with a first capacitor, forming a series circuit coupled between the first and second DC pads, a terminal of the first transistor generating a trigger signal in response to detection of an ESD event, a gate of the first transistor driven by a delay circuit coupled between the first and second DC pads;
a discharge circuit coupled to the trigger circuit to receive the trigger signal, the discharge circuit conducting current between the first and second DC pads in response to the trigger signal.

15. The electrostatic discharge (ESD) protection circuit of claim 14, wherein the discharge circuit comprises a second transistor coupled between the first and the second DC pads and driven by the trigger signal.

16. The electrostatic discharge (ESD) protection circuit of claim 14, wherein the delay circuit further comprises a second capacitor and a resistive element connected in series between the first and the second DC pads, an RC time constant of the second capacitor and the resistive element is greater than an RC time constant of the first capacitor and the first transistor.

17. The electrostatic discharge (ESD) protection circuit of claim 16, wherein the RC time constant of the first capacitor and the first transistor is less than about one nanosecond.

18. The electrostatic discharge (ESD) protection circuit of claim 16, wherein the RC time constant of the second capacitor and the resistive element is greater than about 100 nanoseconds.

19. The electrostatic discharge (ESD) protection circuit of claim 14, wherein the discharge circuit comprises an NPN driver or a PNP driver coupled between the first and the second DC pads and controlled by the trigger signal.

20. The electrostatic discharge (ESD) protection circuit of claim 14, wherein the discharge circuit comprises an NMOS transistor or a PMOS transistor.

21. The electrostatic discharge (ESD) protection circuit of claim 14, wherein the first transistor comprises an NIVIOS transistor or a PMOS transistor.

22. The electrostatic discharge (ESD) protection circuit of claim 14, wherein the delay circuit comprises a variable RC delay turn on circuit coupled between the first and the second DC pads.

23. The electrostatic discharge (ESD) protection circuit of claim 14, further comprising:
a third DC pad coupled to the discharge circuit;
the discharge circuit configured to not conduct current between the first and second pads in response to signal on the third DC pad.

24. The electrostatic discharge (ESD) protection circuit of claim 14, further comprising:
a third DC pad coupled to the trigger circuit;
wherein a signal on the third DC pad controls a gate of the first transistor.

25. The electrostatic discharge (ESD) protection circuit of claim 14, further comprising:
a third DC pad;
wherein the delay circuit comprises a variable RC delay turn on circuit controlled by a signal on the third DC pad;
a gate of a second transistor being controlled by the variable RC delay turn on circuit.

26. The electrostatic discharge (ESD) protection circuit of claim 14, further comprising:
a third DC pad;
wherein the delay circuit comprises a variable RC delay turn on circuit controlled by a signal on the third DC pad;
a gate of the first transistor being controlled by the variable RC delay turn on circuit.

27. An electrostatic discharge (ESD) protection circuit, comprising:
a trigger circuit including:
a first resistor and a first capacitor arranged in series and forming a series circuit between a first DC pad and a second DC pad, the first resistor and the first capacitor being connected at a first node;
a first transistor and a second capacitor arranged in series between the first and second DC pads, the first transistor and the second capacitor being connected at a second node, a gate of the first transistor being controlled by a signal at the first node;
a discharge circuit including:
a driver connected between the first and second DC pads, the driver being controlled by a signal at the second node.

28. The electrostatic discharge (ESD) protection circuit according to claim 27, wherein an RC time constant of the first resistor and the first capacitor is greater than an RC time constant of the first transistor and the second capacitor.

29. The electrostatic discharge (ESD) protection circuit according to claim 27, wherein the driver comprises a PNP bipolar driver or an NPN bipolar driver.

30. The electrostatic discharge (ESD) protection circuit according to claim 27, wherein the driver comprises an NMOS transistor or a PMOS transistor.

31. The electrostatic discharge (ESD) protection circuit according to claim 27, wherein the driver is disabled by a signal on a third DC pad.

32. The electrostatic discharge (ESD) protection circuit according to claim 27, wherein one or more delay elements are connected between the second node and the driver.

33. The electrostatic discharge (ESD) protection circuit according to claim 27, wherein one or more delay elements are connected between the first node and the gate of the first transistor.

* * * * *